(12) United States Patent
Binnard et al.

(10) Patent No.: US 7,417,714 B2
(45) Date of Patent: Aug. 26, 2008

(54) STAGE ASSEMBLY WITH MEASUREMENT SYSTEM INITIALIZATION, VIBRATION COMPENSATION, LOW TRANSMISSIBILITY, AND LIGHTWEIGHT FINE STAGE

(75) Inventors: Michael Binnard, Belmont, CA (US);
Wen-Hou Ma, Los Altos, CA (US);
Toshio Ueta, Kumagaya (JP);
Pai-Hsueh Yang, Palo Alto, CA (US);
Ting-Chien Teng, Fremont, CA (US);
Bausan Yuan, San Jose, CA (US)

(73) Assignee: Nikon Corporation, Tokyo (JP)

( * ) Notice: Subject to any disclaimer, the term of this patent is extended or adjusted under 35 U.S.C. 154(b) by 281 days.

(21) Appl. No.: 11/258,249

(22) Filed: Oct. 24, 2005

(65) Prior Publication Data

US 2006/0101928 A1    May 18, 2006

Related U.S. Application Data

(63) Continuation-in-part of application No. 11/048,405, filed on Jan. 31, 2005.

(60) Provisional application No. 60/624,385, filed on Nov. 2, 2004, provisional application No. 60/625,699, filed on Nov. 4, 2004, provisional application No. 60/647,901, filed on Jan. 28, 2005.

(51) Int. Cl.
*G03B 27/58* (2006.01)
*G03B 27/62* (2006.01)
*G03B 27/42* (2006.01)

(52) U.S. Cl. .............................. 355/72; 355/75; 355/53

(58) Field of Classification Search .................... 355/72, 355/75, 53; 356/399, 400, 401; 318/649, 318/640
See application file for complete search history.

(56) References Cited

U.S. PATENT DOCUMENTS 3,652,146 A    3/1972    George (Continued)

FOREIGN PATENT DOCUMENTS

JP    03-01552    6/2004

(Continued)

OTHER PUBLICATIONS

Schott Lithotec. *Zero Thermal Expansion Glass Ceramic.* Zerodur. (early as Mar. 2004).
Berlinger Glas KG. *Sericonductor industry.* http://www.beringerglas.com/application/semiconductor.php. Dec. 3, 2004.

*Primary Examiner*—Peter B. Kim
(74) *Attorney, Agent, or Firm*—Steven G. Roeder; James P. Broder

(57) ABSTRACT

A stage assembly (220) that moves a work piece (200) about a first axis and along a first axis includes a first stage (238), a second stage (240) that retains the work piece (200), a second mover assembly (244), a measurement system, and an initialization system (1081A). The second mover assembly (244) moves the second stage (240) relative to the first stage (238) about the first axis. The measurement system (22) monitors the position of the second stage (240) about the first axis when the second stage (240) is positioned within a working range about the first axis. The initialization system (1081A) facilitates movement of the second stage (240) about the first axis when the second stage (240) is rotated about the first axis outside the working range. The second mover assembly (244) can include a mover (255) and a dampener (410) that reduces the transmission of vibration from the first stage (238) to the second stage (240). In addition, the stage assembly (220) can include a control system (24) that directs power to the mover (255) to position the second stage (240) and to compensate for vibration of the first stage (238).

25 Claims, 27 Drawing Sheets

U.S. PATENT DOCUMENTS

| | | | |
|---|---|---|---|
| 4,120,210 A | 10/1978 | Sloyan | |
| 4,538,885 A | 9/1985 | Graham et al. | |
| 4,684,315 A | 8/1987 | Sughishima et al. | |
| 4,979,195 A | 12/1990 | Tabata et al. | |
| 5,073,912 A | 12/1991 | Kobayashi et al. | |
| 5,120,034 A | 6/1992 | Van Engelen et al. | |
| 5,214,290 A | 5/1993 | Sakai | |
| 5,552,888 A | 9/1996 | Sogard et al. | |
| 5,623,853 A | 4/1997 | Novak et al. | |
| 5,877,845 A | 3/1999 | Makinouchi | |
| 5,969,441 A | 10/1999 | Loopstra et al. | |
| 6,008,500 A | 12/1999 | Lee | |
| 6,130,517 A | 10/2000 | Yuan et al. | |
| 6,281,655 B1 | 8/2001 | Poon et al. | |
| 6,337,484 B1 | 1/2002 | Loopstra et al. | |
| 6,473,161 B1 | 10/2002 | Cuijpers et al. | |
| 6,597,429 B2 | 7/2003 | Janssen et al. | |
| 2003/0010935 A1 | 1/2003 | Sogard et al. | |
| 2003/0098664 A1 | 5/2003 | Watson et al. | |

FOREIGN PATENT DOCUMENTS

| | | |
|---|---|---|
| JP | 04-00669 | 7/2004 |
| WO | WO1999/05573 A1 | 2/1999 |
| WO | WO1999/22272 A1 | 5/1999 |

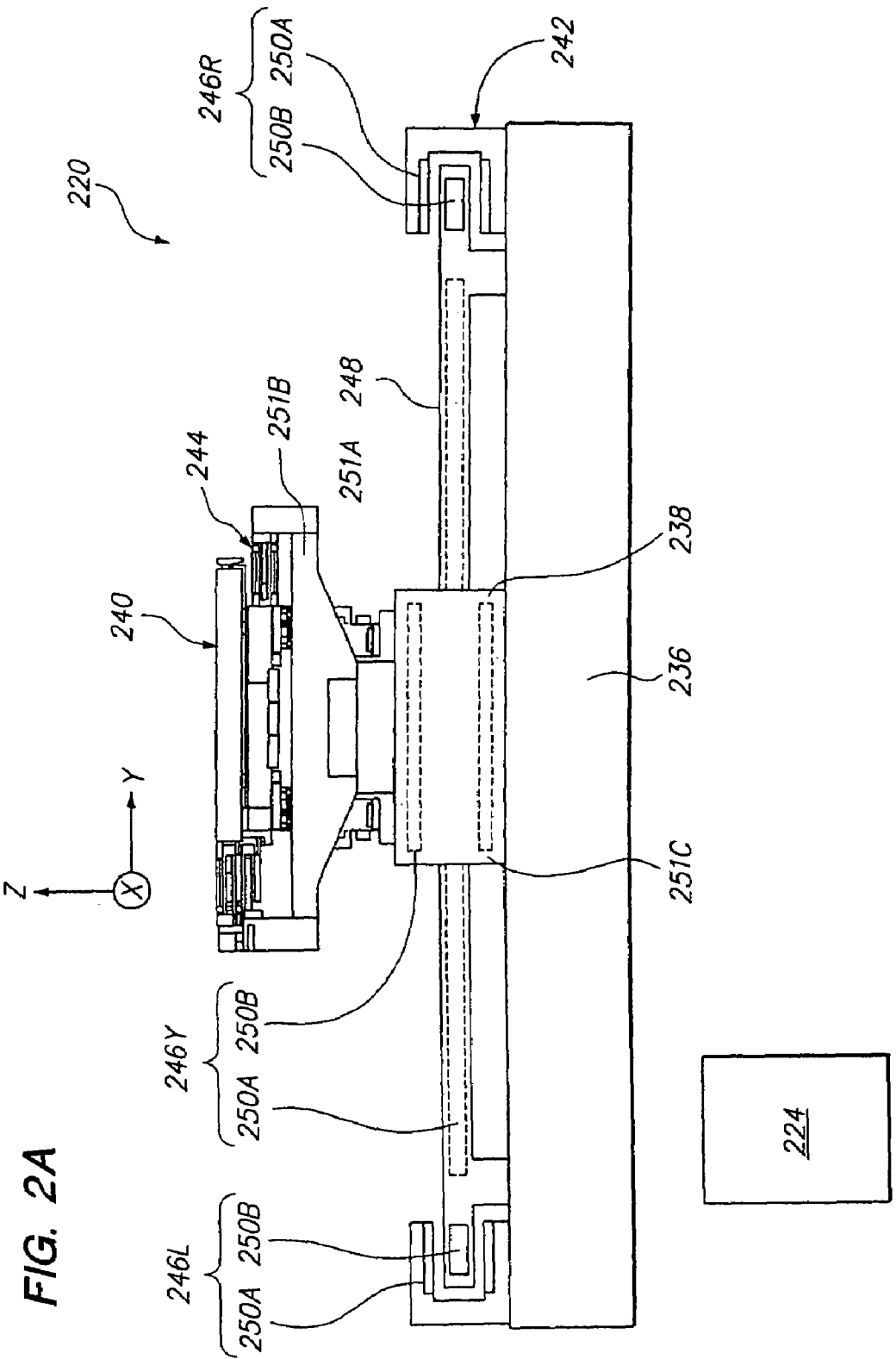

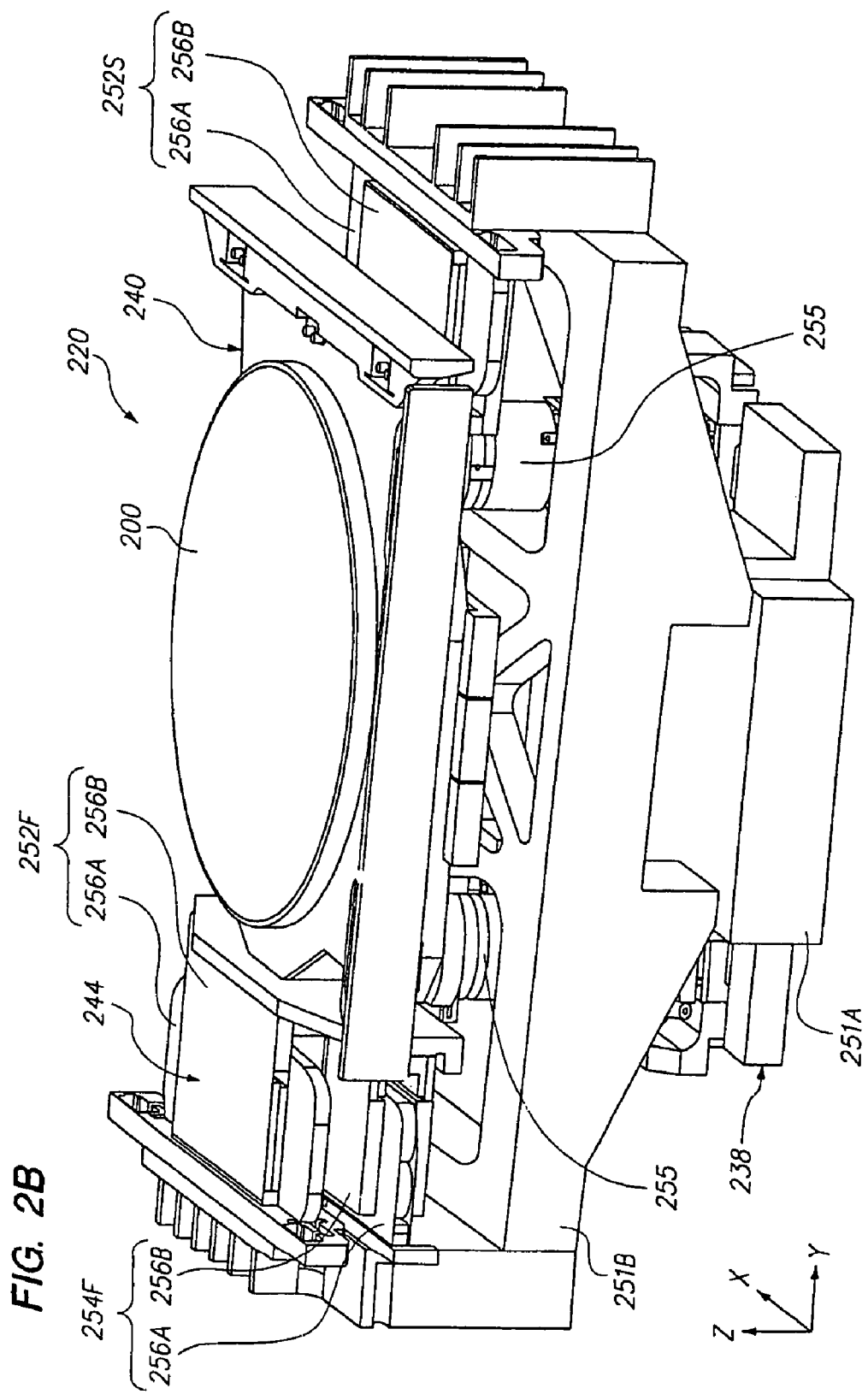

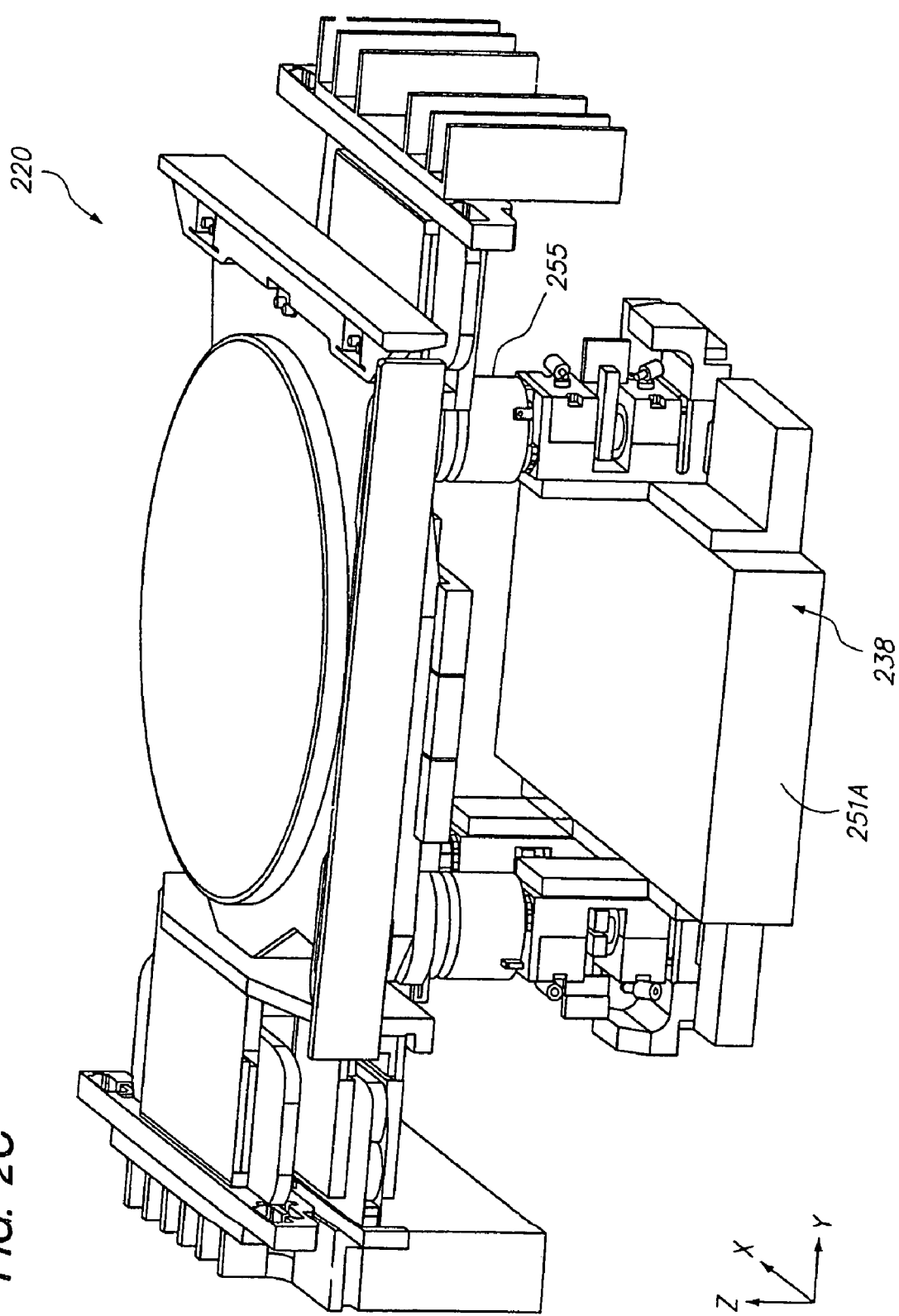

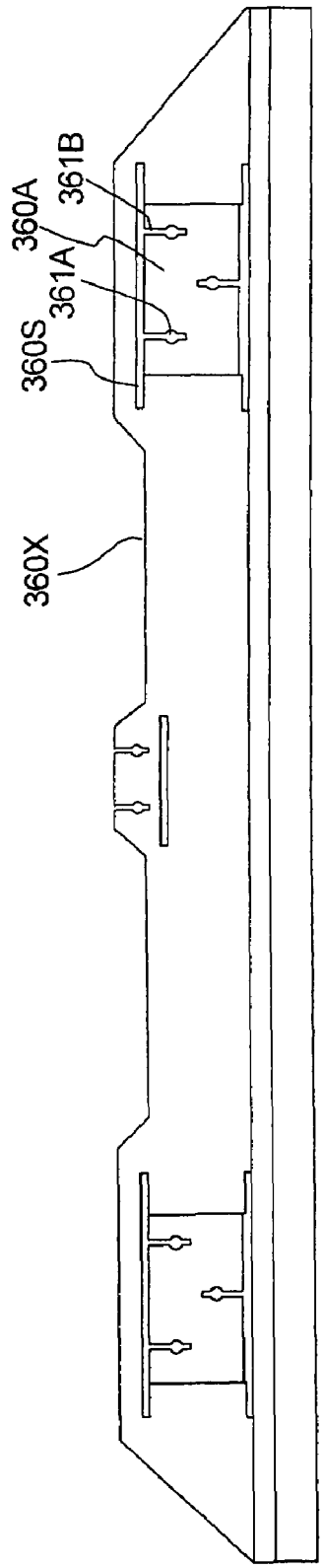
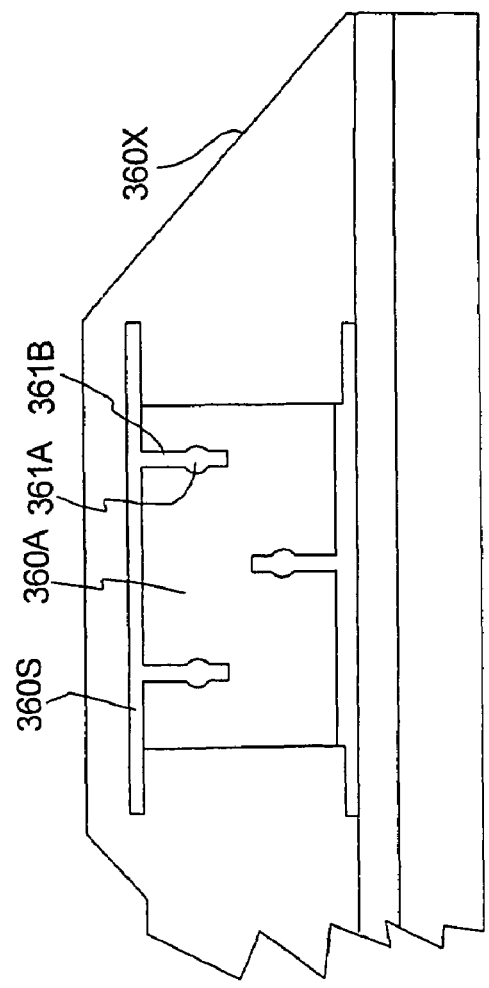
Fig. 3C
Fig. 3D

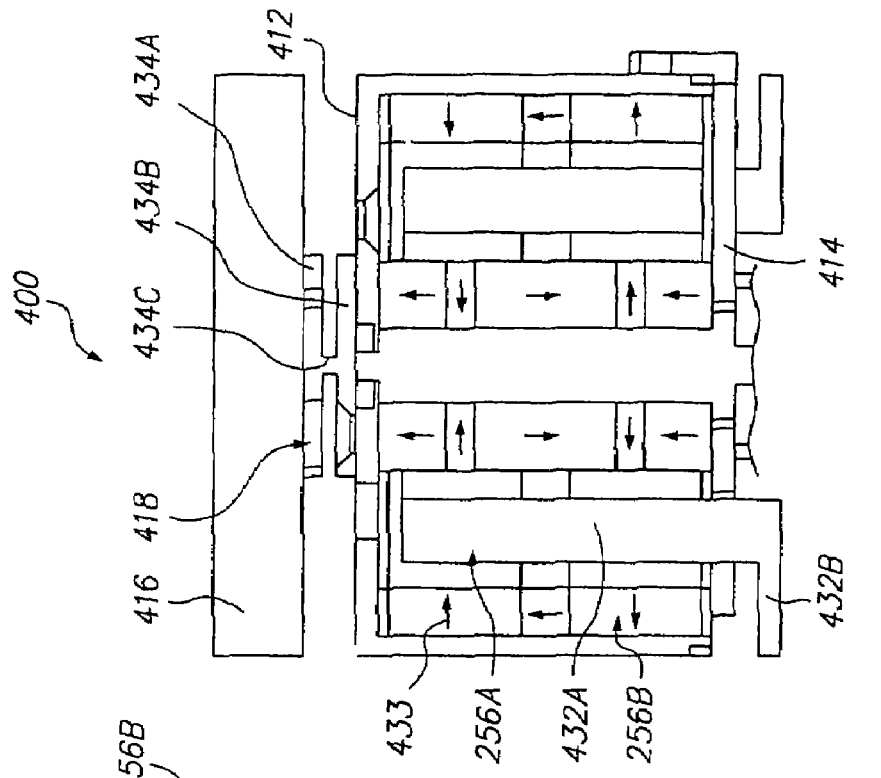
FIG. 4D
FIG. 4C
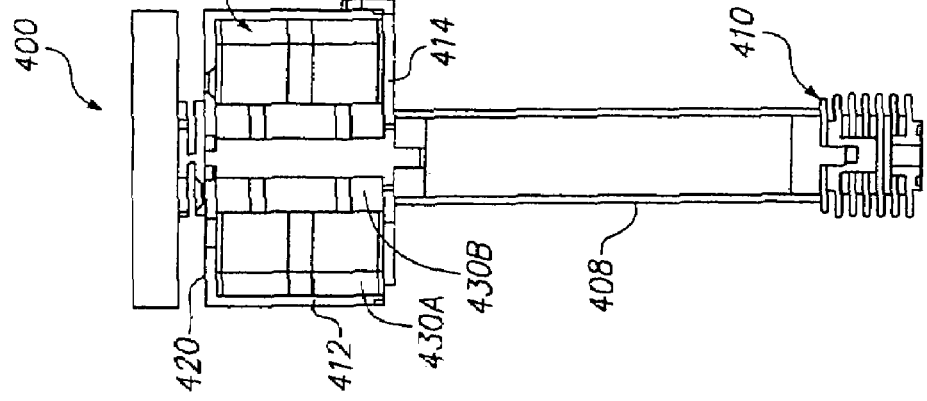
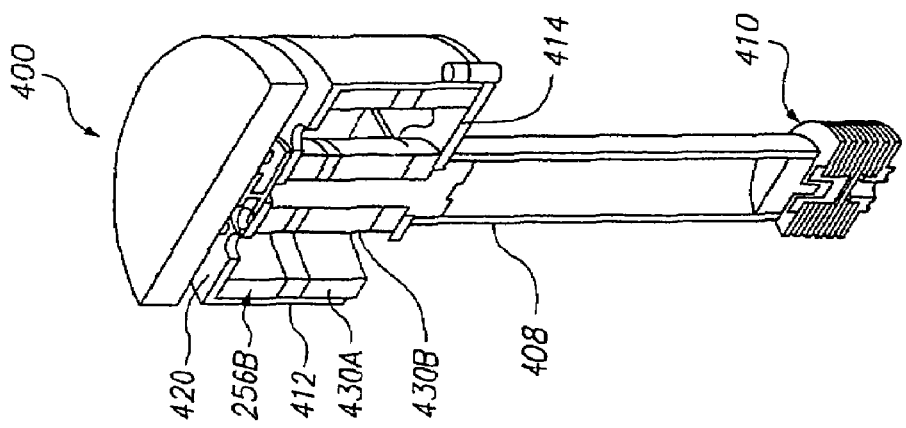
FIG. 4B

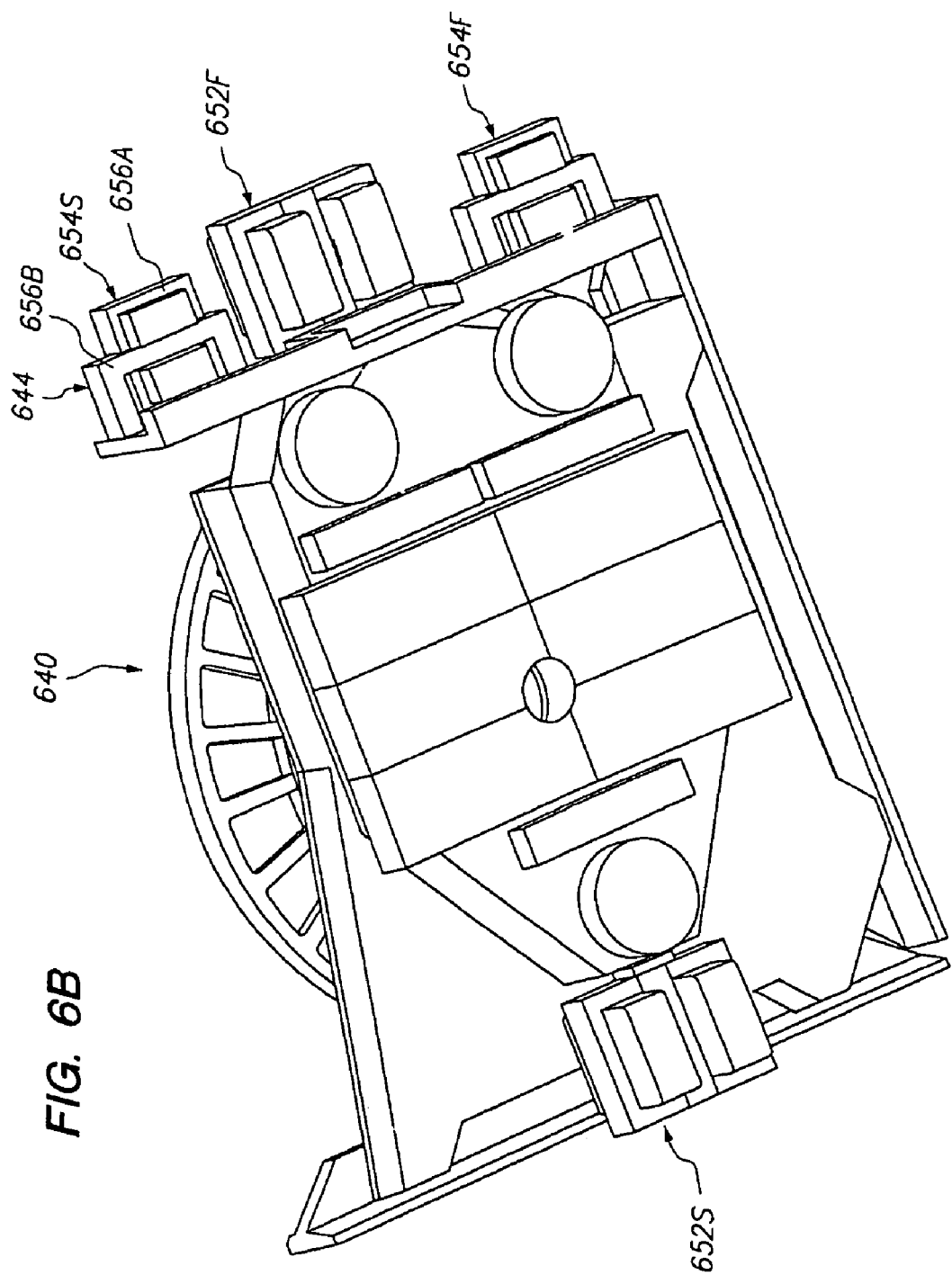

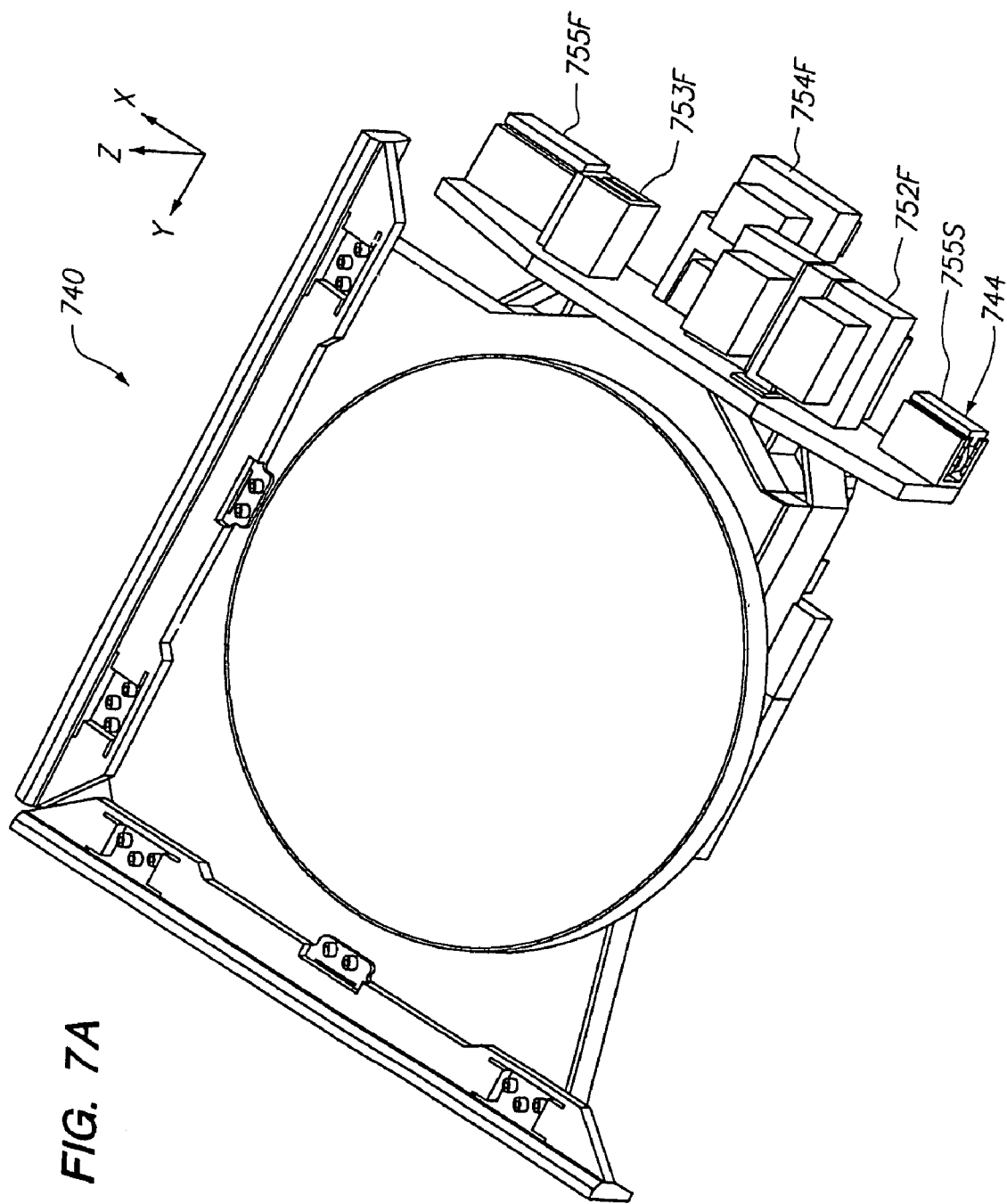

STAGE ASSEMBLY WITH MEASUREMENT SYSTEM INITIALIZATION, VIBRATION COMPENSATION, LOW TRANSMISSIBILITY, AND LIGHTWEIGHT FINE STAGE

RELATED APPLICATION

This application is a continuation-in-part of U.S. application Ser. No. 11/048,405 filed on Jan. 31, 2005, and entitled "Stage Assembly with Lightweight Fine Stage and Low Transmissibility" which is currently pending. This application also claims priority on U.S. Provisional Application Ser. No. 60/624,385 filed on Nov. 2, 2004 and entitled "FINE STAGE DESIGN", U.S. Provisional Application Ser. No. 60/625,699 filed on Nov. 4, 2004 and entitled "Z ACTUATOR", and U.S. Provisional Application Ser. No. 60/647,901 filed on Jan. 28, 2005 and entitled "FINE STAGE 'Z' ACTUATOR DEVICE AND METHOD". As far as is permitted, the contents of U.S. application Ser. No. 11/048,405, and U.S. Provisional Application Ser. Nos. 60/624,385; 60/625,699; and 60/647,901 are incorporated herein by reference.

BACKGROUND

Exposure apparatuses for semiconductor processing are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, a measurement system, and a control system.

A common type of stage assembly includes a coarse stage, a coarse mover assembly that moves the coarse stage, a fine stage, and a fine mover assembly that moves the fine stage. With this design, the measurement system constantly monitors the position of the fine stage.

With certain stage designs, vibration and disturbances from the ground or the environment are transferred to the coarse stage and subsequently transmitted to the fine stage. This can cause errors in the positioning of the fine stage. The size of the images and features within the images transferred onto the wafer from the reticle are extremely small. As a result thereof, the precise positioning of the wafer and the reticle is critical to the manufacture of high density, semiconductor wafers.

SUMMARY

The present invention is directed to a stage assembly that moves a work piece. The stage assembly includes a first stage, a second stage that retains the work piece, a second mover assembly that moves the second stage relative to the first stage about a first axis, a measurement system, and an initialization system. The measurement system monitors the position of the second stage about the first axis when the second stage is positioned within a FA working range about the first axis. The initialization system facilitates movement of the second stage about the first axis when the second stage is rotated about the first axis outside the FA working range.

In one embodiment, the measurement system monitors the position of the second stage about a second axis when the second stage is positioned within the SA working range about the second axis and/or monitors the position of the second stage about a third axis when the second stage is positioned within the TA working range about the third axis. In this embodiment, the initialization system monitors the position of the second stage about the first, second, and/or third axes.

In another embodiment, the initialization system includes a first aligner. In this embodiment, the second mover assembly moves the second stage against the first aligner to orient and align the second stage within the FA working range. Additionally, the initialization system can include a second aligner. In this embodiment, the second mover assembly moves the second stage against the second aligner to orientate and align the second stage within the SA working range.

In still another embodiment, the second mover assembly moves the second stage relative to the first stage along the first axis. The second mover assembly includes a mover and a dampener that influences the transmission of vibration from the first stage to the second stage. In one embodiment, the stage assembly includes a control system that directs power to the mover to position the second stage and to at least partly compensate for vibration of the first stage being transferred via the dampener.

The present invention is also directed a stage assembly that moves a work piece along a first axis, along a second axis and along a third axis. The stage assembly includes a first stage, a first mover assembly that moves the first stage along the first axis, a second stage that retains the work piece, a second mover assembly, and a non-contact bearing. In certain embodiments, the second mover assembly moves the second stage relative to the first stage along the first axis, along the second axis, and along the third axis. Further, the non-contact bearing supports the mass of the second stage and the non-contact bearing allows the second stage to move relative to the first stage along the first axis and along the second axis.

In one embodiment, the second mover assembly moves the second stage with at least four degrees of movement. In another embodiment, the second mover assembly moves the second stage with at least six degrees of movement.

The second mover assembly includes a Z mover that moves the second stage relative to the first stage along the third axis. In this design, the non-contact bearing supports the second stage relative to the Z mover. The Z mover includes a Z housing, a Z mover output, and a connector assembly that allows the Z mover output to tilt relative to the Z housing. In one embodiment, the second mover assembly includes three spaced apart Z movers that move the second stage relative to the first stage along the third axis, about the first axis, and about the second axis, and the non-contact bearing supports the second stage relative to the Z movers.

In one embodiment, the Z mover includes a first mover component, a second mover component that interacts with the first mover component to move the second stage relative to the first stage along the third axis, and a Z dampener that inhibits vibration from the first stage along the third axis from being transmitted to the second stage.

In another embodiment, the second stage includes a stage mounting surface. Further, the second mover assembly includes a first mover component that is coupled to the first stage and a second mover component that is coupled to the second stage. In this embodiment, the second mover component includes a mover mounting surface that engages the stage mounting surface. In one embodiment, the mover mounting surface cantilevers away from the stage mounting surface so that deformation of the second mover component occurs without deformation of the stage mounting surface.

In still another embodiment, the stage assembly includes a coarse stage, a coarse mover assembly that moves the coarse stage, a fine stage that retains the work piece, and a fine mover assembly that moves the fine stage relative to the coarse stage. In one version, the fine stage includes an upper plate, a lower plate and a plurality of walls that are positioned between the plates.

In still another embodiment, the stage assembly includes a fluid source of a fluid at a reduce pressure, a first stage, a second stage that includes a chuck that retains the work piece, a mover assembly that moves the second stage relative to the first stage, and a bearing assembly that supports the second stage relative to the first stage. In this embodiment, the second stage includes a bearing surface having an inlet port that is in fluid communication with the chuck. Further, the bearing assembly is in fluid communication with the fluid source so that the fluid at the reduced pressure is in fluid communication with the inlet port and the chuck.

Further, the present invention is also directed to a method for moving a stage, a method for manufacturing an exposure apparatus, and a method for manufacturing an object or a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 2A is a simplified side view of one embodiment of a stage assembly having features of the present invention;

FIG. 2B is a perspective view of a portion of the stage assembly of FIG. 2A;

FIG. 2C is another perspective view of a portion of the stage assembly of FIG. 2A;

FIG. 3C is a top view of the mirror of FIG. 3B;

FIG. 3D is a top view of a portion of the mirror of FIG. 3C;

FIGS. 3H and 3I are alternative, exploded perspective views of a table;

FIG. 4B is a cross-sectional perspective view of a portion of the Z mover;

FIG. 4C is a cross-sectional plan view of a portion of the Z mover;

FIG. 4D is an enlarged cross-sectional plan view of a portion of the Z mover;

FIG. 6B is a bottom perspective of the portion of the stage assembly of FIG. 6A;

FIG. 7A is a top perspective of another embodiment of a portion a stage assembly;

DESCRIPTION

Figure 1:
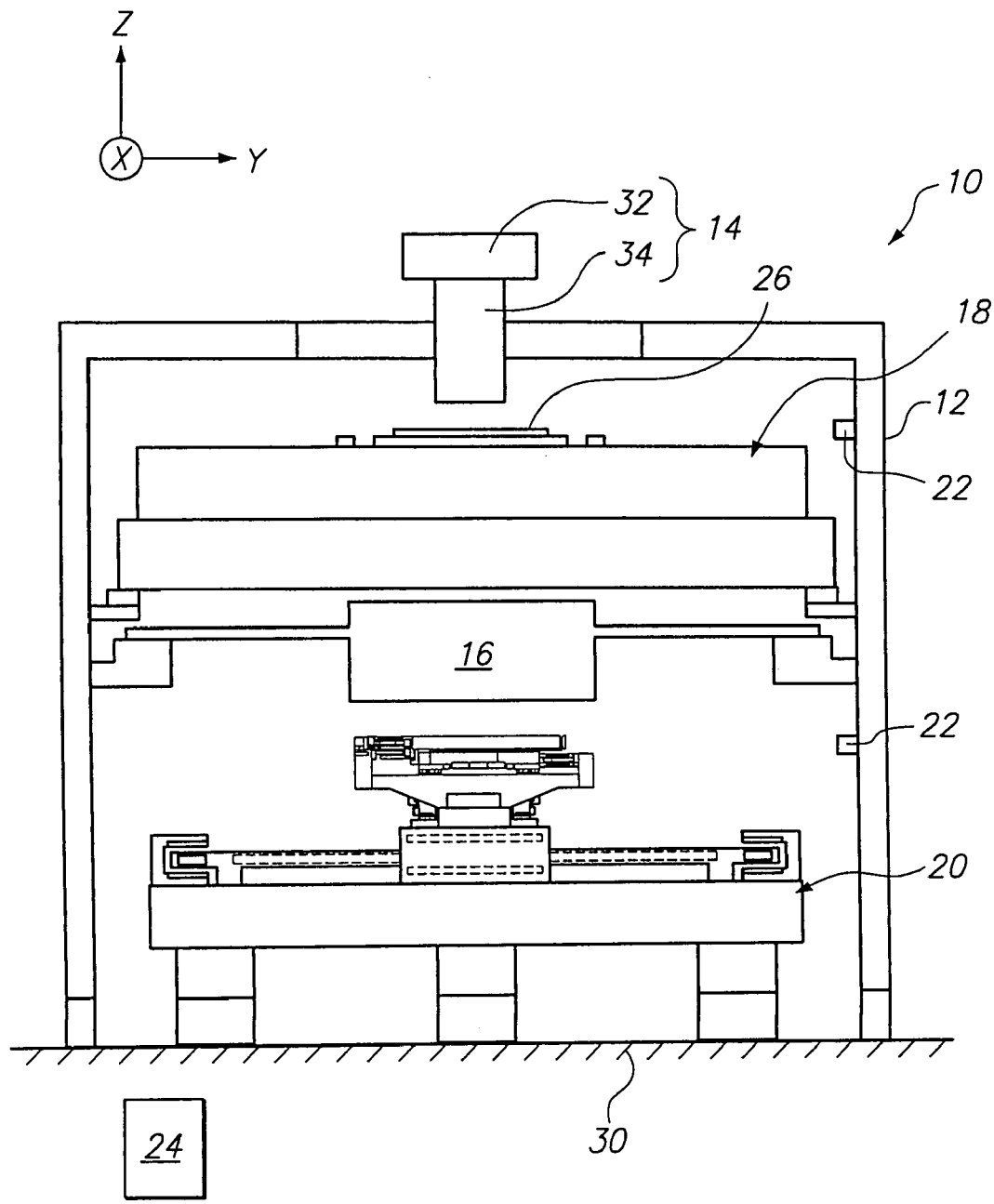
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

A number of Figures include an orientation system that illustrates an X axis, a Y axis that is orthogonal to the X axis and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 26 onto a semiconductor wafer 200 (illustrated in FIG. 2B). The exposure apparatus 10 mounts to a mounting base 30, e.g., the ground, a base, or floor or some other supporting structure.

There are a number of different types of lithographic devices. For example, the exposure apparatus 10 can be used as a scanning type photolithography system that exposes the pattern from the reticle 26 onto the wafer 200 with the reticle 26 and the wafer 200 moving synchronously. In a scanning type lithographic device, the reticle 26 is moved perpendicularly to an optical axis of the optical assembly 16 by the reticle stage assembly 18 and the wafer 200 is moved perpendicularly to the optical axis of the optical assembly 16 by the wafer stage assembly 20. Scanning of the reticle 26 and the wafer 200 occurs while the reticle 26 and the wafer 200 are moving synchronously.

Alternatively, the exposure apparatus 10 can be a step-and-repeat type photolithography system that exposes the reticle 26 while the reticle 26 and the wafer 200 are stationary. In the step and repeat process, the wafer 200 is in a constant position relative to the reticle 26 and the optical assembly 16 during the exposure of an individual field. Subsequently, between consecutive exposure steps, the wafer 200 is consecutively moved with the wafer stage assembly 20 perpendicularly to the optical axis of the optical assembly 16 so that the next field of the wafer 200 is brought into position relative to the optical assembly 16 and the reticle 26 for exposure. Following this process, the images on the reticle 26 are sequentially exposed onto the fields of the wafer 200, and then the next field of the wafer 200 is brought into position relative to the optical assembly 16 and the reticle 26.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports the components of the exposure apparatus 10. The apparatus frame 12 illustrated in FIG. 1 supports the reticle stage assembly 18, the optical assembly 16 and the illumination system 14 above the mounting base 30.

The illumination system 14 includes an illumination source 32 and an illumination optical assembly 34. The illumination source 32 emits a beam (irradiation) of light energy. The illumination optical assembly 34 guides the beam of light energy from the illumination source 32 to the optical assembly 16. The beam illuminates selectively different portions of the reticle 26 and exposes the wafer 200. In FIG. 1, the illumination source 32 is illustrated as being supported above the reticle stage assembly 18. Typically, however, the illumination source 32 is secured to one of the sides of the apparatus frame 12 and the energy beam from the illumination source 32 is directed to above the reticle stage assembly 18 with the illumination optical assembly 34.

The illumination source 32 can be a g-line source (436 nm), an i-line source (365 nm), a KrF excimer laser (248 nm), an ArF excimer laser (193 nm) or a $F_2$ laser (157 nm). Alternatively, the illumination source 32 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 26 to the wafer 200. Depending upon the design of the exposure apparatus 10, the optical assembly 16 can magnify or reduce the image illuminated on the reticle 26. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668, 672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 26 relative to the optical assembly 16 and the wafer 200. Somewhat similarly, the wafer stage assembly 20 holds and positions the wafer 200 with respect to the projected image of the illuminated portions of the reticle 26.

Further, in photolithography systems, when linear motors (see U.S. Pat. No. 5,623,853 or 5,528,118) are used in a wafer stage or a mask stage, the linear motors can be either an air levitation type employing air bearings or a magnetic levitation type using Lorentz force or reactance force. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528, 100 and 5,874,820 and Japanese Patent Application Disclosure No. 8-330224 are incorporated herein by reference.

The measurement system 22 monitors movement of the reticle 26 and the wafer 200 relative to the optical assembly 16 or some other reference. With this information, the control system 24 can control the reticle stage assembly 18 to precisely position the reticle 26 and the wafer stage assembly 20 to precisely position the wafer 200. For example, the measurement system 22 can utilize multiple laser interferometers, encoders, and/or other measuring devices.

The control system 24 is connected to the reticle stage assembly 18, the wafer stage assembly 20, and the measurement system 22. The control system 24 receives information from the measurement system 22 and controls the stage mover assemblies 18, 20 to precisely position the reticle 26 and the wafer 200. The control system 24 can include one or more processors and circuits.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

FIG. 2A is a simplified view of a control system 224 and a side view of one embodiment of a stage assembly 220 that is used to position a work piece 200 (illustrated in FIG. 2B). For example, the stage assembly 220 can be used as the wafer stage assembly 20 in the exposure apparatus 10 of FIG. 1. In this embodiment, the stage assembly 220 would position the wafer 200 (illustrated in FIG. 2B) during manufacturing of the semiconductor wafer 200. Alternatively, the stage assembly 220 can be used to move other types of work pieces 200 during manufacturing and/or inspection, to move a device under an electron microscope (not shown), or to move a device during a precision measurement operation (not shown). For example, the stage assembly 220 could be designed to function as the reticle stage assembly 18.

In this embodiment, the stage assembly 220 includes a stage base 236, a first stage 238, a second stage 240, a first mover assembly 242, and a second mover assembly 244. The size, shape, and design of each these components can be varied. The control system 224 precisely controls the mover assemblies 242, 244 to precisely position the work piece 200.

In FIG. 2A, the stage base 236 supports some of the components of the stage assembly 220 and guides the movement of the first stage 238 along the X axis, along the Y axis and about the Z axis. In this embodiment, the stage base 236 is generally rectangular shaped.

The first stage 238 facilitates relatively large movements of the second stage 240 and is commonly referred to as the coarse stage. In one embodiment, the first stage 238 supports the second stage 240 and the second mover assembly 244. In one embodiment, the first stage 238 includes an lower support 251A, an upper support 251B secured to the lower support 251A, and a stage frame 251C that supports the lower support 251A. In FIG. 2A, a bearing (not shown) supports the first stage 238 above the stage base 236 and allows the first stage 238 to move relative to the stage base 236 along the X axis, along the Y axis and about the Z axis. The bearing, for example, can be a vacuum preload type fluid bearing, a magnetic type bearing or a roller type assembly.

The second stage 240 retains the work piece 200 and is commonly referred to as the fine stage. The second stage 240 is described in more detail below.

The first mover assembly 242 moves the first stage 238 and a portion of the second mover assembly 244 relative to the stage base 236. In the embodiment illustrated in FIG. 2A, the first mover assembly 242 moves the first stage 238 with three degrees of movement, namely, along the X axis, along the Y axis and about the Z axis. Alternatively, for example, the first mover assembly 242 could be designed to move the first stage 238 with less than three degrees of movement, or more than three degrees of movement. The first mover assembly 242 can include one or more movers.

In FIG. 2A, the first mover assembly 242 includes a left X coarse mover 246L, a right X coarse mover 246R, a Y coarse mover 246Y (illustrated in phantom), and a guide bar 248.

The X coarse movers 246L, 246R move the guide bar 248, and the first stage 238 along the X axis and with a limited range of motion about the Z axis, and the Y coarse mover 246Y moves the first stage 238 along the Y axis relative to the guide bar 248. The motion about the Z axis is achieved by controlling a difference in the amount of forces generated by the left X coarse mover 246A and the right X coarse mover 246R.

The design of each coarse mover 246L, 246R, 246Y can be varied to suit the movement requirements of the first mover assembly 242. In the embodiment illustrated in FIG. 2A, each of the coarse movers 246L, 246R, 246Y includes a first coarse component 250A and a second coarse component 250B that interacts with the first coarse component 250A. In this embodiment, each of the coarse movers 246L, 246R, 246Y is a linear motor and one of the coarse components 250A, 250B includes a magnet array having one or more magnets and one of the coarse components 250B, 250A includes a conductor array having one or more coils. In FIG. 2A, the first coarse component 250A of each X coarse mover 246L, 246R is secured to the stage base 236 and the second coarse component 250B of each X coarse mover 246L, 246R is secured to the guide bar 248. Further, the first coarse component 250A of the Y coarse mover 246Y is secured to the guide bar 248 and the second coarse component 250B of the Y coarse mover 246Y is secured to the first stage 238.

Alternatively, one or more of the coarse movers 246L, 246R, 246Y can be another type of motor, such as a rotary motors, a voice coil motor, an electromagnetic mover, a planar motor, or some other force mover.

The guide bar 248 guides the movement of the first stage 238 along the Y axis. A bearing (not shown) such as a fluid type bearing or a magnetic type bearing can be disposed between the guide bar 248 and the first stage 238. Another bearing (not shown) maintains the guide bar 248 spaced apart along the Z axis relative to the stage base 236 and allows for motion of the guide bar 248 along the X axis and about the Z axis relative to the stage base 236. The bearing, for example, can be a vacuum preload type fluid bearing, a magnetic type bearing or a roller type assembly.

The second mover assembly 244 moves and positions the second stage 240 and the work piece 200. In FIG. 2A, the second mover assembly 244 moves the second stage 240 with six degrees of movement, namely, along the X, Y, and Z axes, and about the X, Y, and Z axes relative to the first stage 238. Alternatively, the second mover assembly 244 could be designed to move the second stage 240 with less than six degrees of movement. The second mover assembly 244 can include one or more movers.

FIG. 2B is a perspective view of a portion of the stage assembly 220 of FIG. 2A. More specifically, FIG. 2B illustrates the second stage 240, the second mover assembly 244, and a portion of the first stage 238, namely the lower support 251A and the upper support 251B.

FIG. 2B also illustrates one embodiment of the second mover assembly 244 in more detail. In particular, in this embodiment, the second mover assembly 244 includes a first X mover 252F, a second X mover 252S, a first Y mover 254F, a second Y mover 254S (illustrated in FIG. 3A), and three spaced apart Z movers 255 (only two are illustrated in FIG. 2B). The X movers 252F, 252S move the second stage 240 along the X axis, the Y movers 254F, 254S move the second stage 240 along the Y axis, the Z movers 255 move the second stage 240 along the Z axis and about the X and Y axes, and either the X movers 252F, 252S or the Y movers 254F, 254S can be used to move the second stage 240 about the Z axis.

The design of each mover 252F, 252S, 254F, 254S, 255 can be varied to suit the movement requirements of the second mover assembly 244. In the embodiment illustrated in FIG. 2B, each of the movers 252F, 252S, 254F, 254S includes a first mover component 256A and a second mover component 256B that interacts with the first mover component 256A. In FIG. 2B, the first mover component 256A of each of the X and Y movers 252F, 252S, 254F, 254S is secured to the upper support 251B of the first stage 238 and the second mover component 256B of each of the X and Y movers 252F, 252S, 254F, 254S is secured to the second stage 240.

In this embodiment, for each mover 252F, 252S, 254F, 254S, one of the mover components 256A, 256B includes a magnet array having one or more magnets and one of the mover components 256B, 256A includes a conductor array having one or more coils. In FIG. 2B, the first mover component 256A for each of the movers 252F, 252S, 254F, 254S, 255 includes a coil array and the second mover component 256B for each of the movers 252F, 252S, 254F, 254S includes a magnet array. With this design, electrical lines that power the second mover assembly 244 do not have to be connected to the second stage 240. However, the invention is not limited to this design. Alternately, the first mover component 256A can include the coil array and the second mover component 256B can include the magnet array.

In FIG. 2B, each of the X movers 252F, 252S is a linear motor and each of the Z movers 255 and the Y movers 254F, 254S is a voice coil motor. Alternatively, one or more of the movers 252F, 252S, 254F, 254S, 255 can be another type of motor, such as a rotary motors, an electromagnetic mover, a planar motor, or some other force mover. For example, each of the X movers 252F, 252S can be a voice coil motor.

Figure 2D:
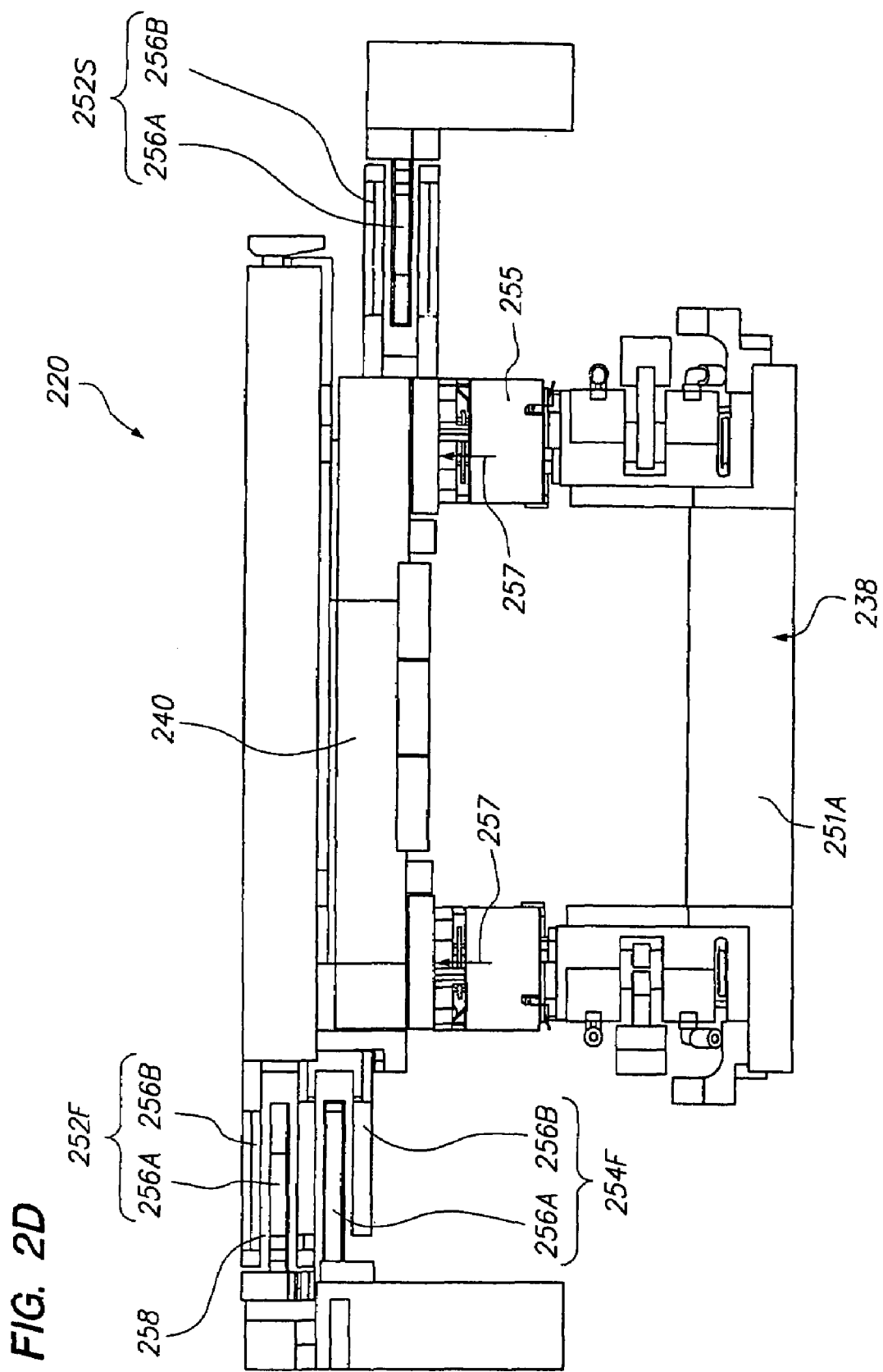
FIG. 2D is a front plan view of the portion of the stage assembly of FIG. 2C.

FIG. 2C is a perspective view and FIG. 2D is a side view of the portion of the stage assembly 220 of FIG. 2B with the upper support 251B of the first stage 238 removed. These figures illustrate that the Z movers 255 are coupled to the lower support 251A of the first stage 238. More specifically, the first mover component 256A is coupled to the lower support 251A. Also, the second mover component 256B is connected to the lower support 251A via a Z beam 408 (illustrated in FIG. 4D) and a Z dampener 410 (illustrated in FIG. 4D).

It should be noted that in this embodiment, as illustrated in FIG. 2D, a sufficient gap 258 exists between the first mover component 256A and the second mover component 256B of the X and Y movers 252F, 252S, 254F, 254S so that the mover components 256A, 256B do not contact each other during the range of movement of the second stage 240 relative to the first stage 238 along Z-axis, about X and Y axes with the Z movers 255.

In this embodiment, a stage bearing assembly 257 (illustrated as arrows) supports the second stage 240 relative to the first stage 238. In one embodiment, the stage bearing assembly 257 supports the second stage 240 relative to the Z movers 255 and allows the second stage 240 to move relative to the Z movers 255 and the first stage 238 substantially along the X and Y axes and about the Z axis. In one embodiment, the stage bearing assembly 257 includes one or more non contact type bearings, such as a fluid type bearing, a vacuum preload type fluid bearing, or a magnetic type bearing. With the non contact type bearing, there is very low transmissibility along the X and Y axes. Stated in another fashion, the non contact type bearing inhibits vibration from the first stage 238 along the X and Y axes from being transmitted to the second stage 240. Moreover, with the non contact type bearing, the second stage 240 can be moved along the X and Y axes and about the Z axis with little to no friction. In one embodiment, the stage bearing assembly 257 includes three spaced apart non contact type bearings to support the second stage 240 in a kinematic fashion.

Figure 3A:
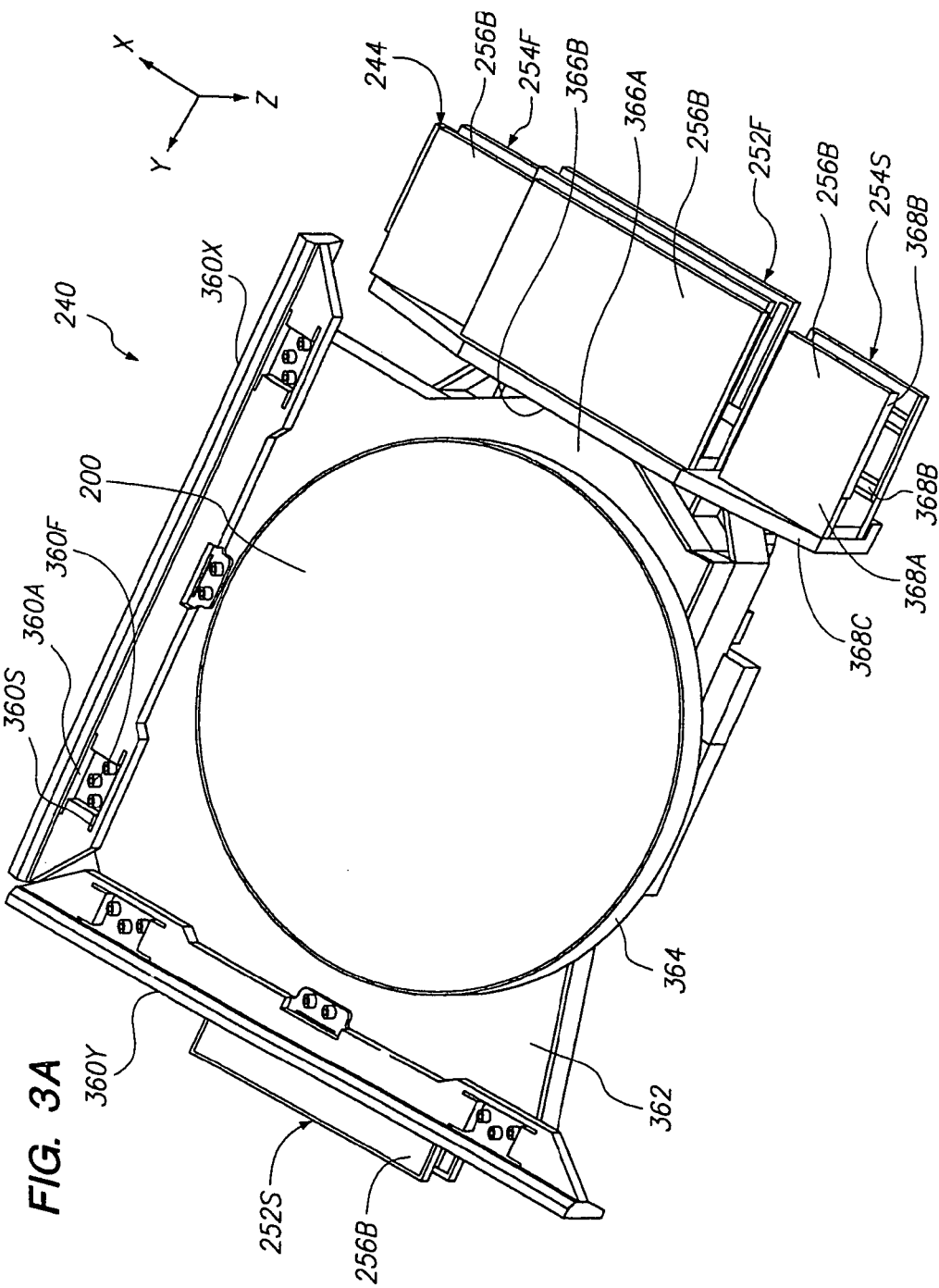
FIG. 3A is a top perspective of a portion a stage assembly and a work piece.

FIG. 3A is a perspective top view of the second stage 240, an X mirror 360X and a Y mirror 360Y that is used in the measurement system 22 of FIG. 1, a portion of the second mover assembly 244, and the work piece 200. In this embodiment, the second stage 240 includes a table 362 and a chuck 364 secured to the table 362 that holds the work piece 200. The table 362 is roughly rectangular shaped and the right side of the table 362 defines a cantilevering, necked region 366A that defines a first mounting surface 366B.

In FIG. 3A, each mirror 360X, 360Y is made of a ceramic material, has a generally "T" shaped cross-section and includes a mirror surface and three spaced apart, relatively thin, attachment areas 360A. One or more fasteners 360F fixedly secure the attachment areas 360A to the table 362. In one embodiment, each attachment area 360A includes one or more slots 360S positioned between the mirror surface and each attachment area 360A that inhibit forces and deformation caused by the fasteners 360F against the attachment areas 360A from deforming the rest of the respective mirror 360X, 360Y.

Figure 3B:
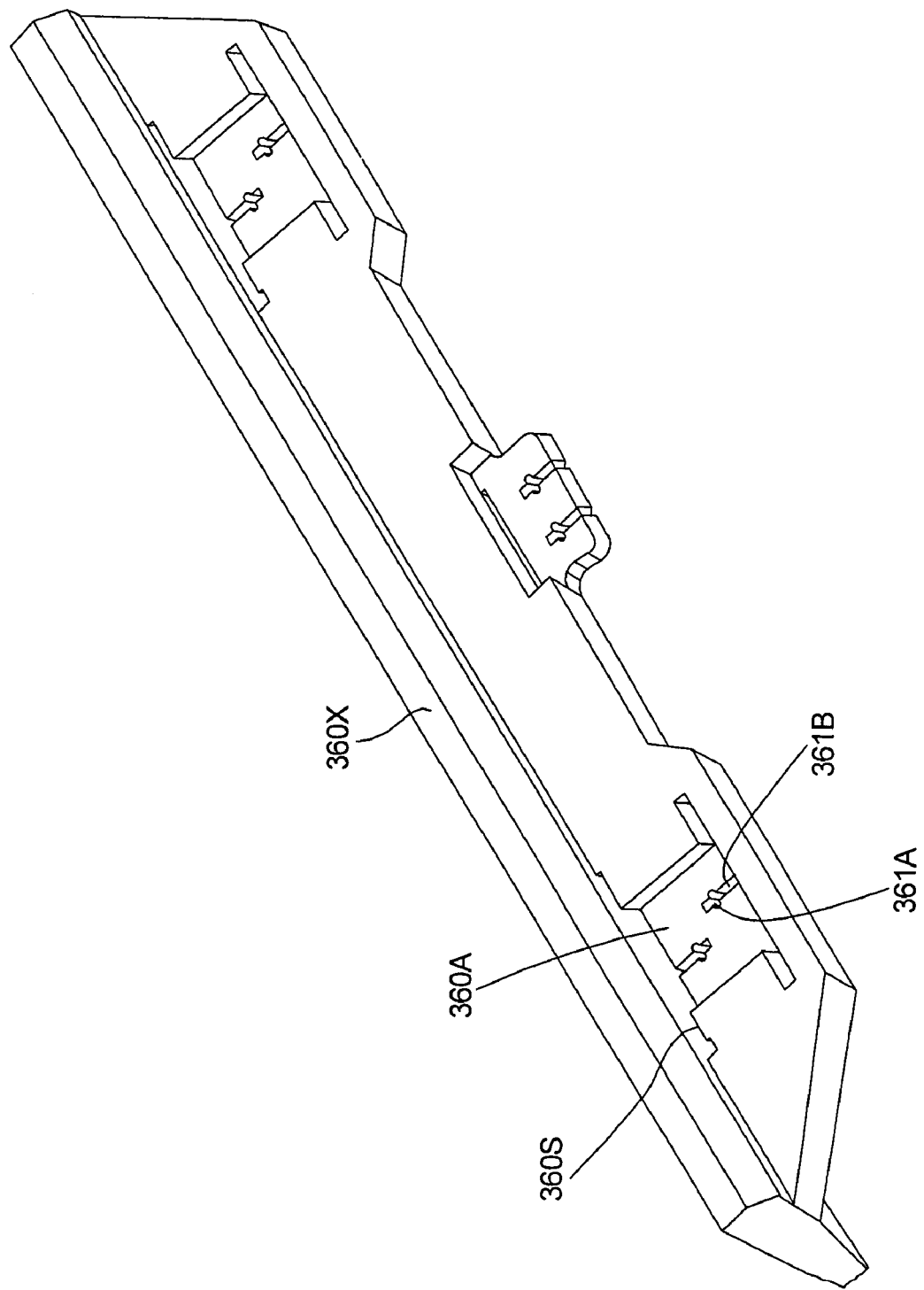
FIG. 3B is a perspective view of a mirror having features of the present invention.

FIG. 3B is a perspective view, FIG. 3C is a top view, and FIG. 3D is a top view of a portion of one of the mirrors, namely the X mirror 360X. These Figures illustrate that the one or more slots 360S separate the attachment areas 360A from the rest of the X mirror 360X. Further, these Figures illustrate that at least one of the attachment areas 360A includes a fastener aperture 361A that receives one fastener 360F (illustrated in FIG. 3A) and an attachment slot 361B that extends between the fastener aperture 361A and the slot 360S. In one embodiment, the attachment slot 361B inhibits forces and deformation caused by the fastener 360F against the attachment area 360A from deforming the rest of the X mirror 360X.

Referring back to FIG. 3A, the second mover component 256B of the first X mover 252F, and the Y movers 254F, 254S are secured to the right side of the table 362, and the second mover component 256B of the second X mover 252S is secured to the left side of the table 362. Further, the second mover component 256B of the first X mover 252F is positioned between the second mover component 256B of the Y movers 254F, 254S. In this embodiment, each second mover component 256B includes a "U" shaped mover housing 368A, and a pair of spaced apart magnet arrays 368B that are secured to the housing 368A. In one embodiment, a mounting bracket 368C secures the mover housing 368A of the first X mover 252F, and the Y movers 254F, 254S to the table 362. In one embodiment, the mounting bracket 368C is generally beam shaped.

Figure 3E:
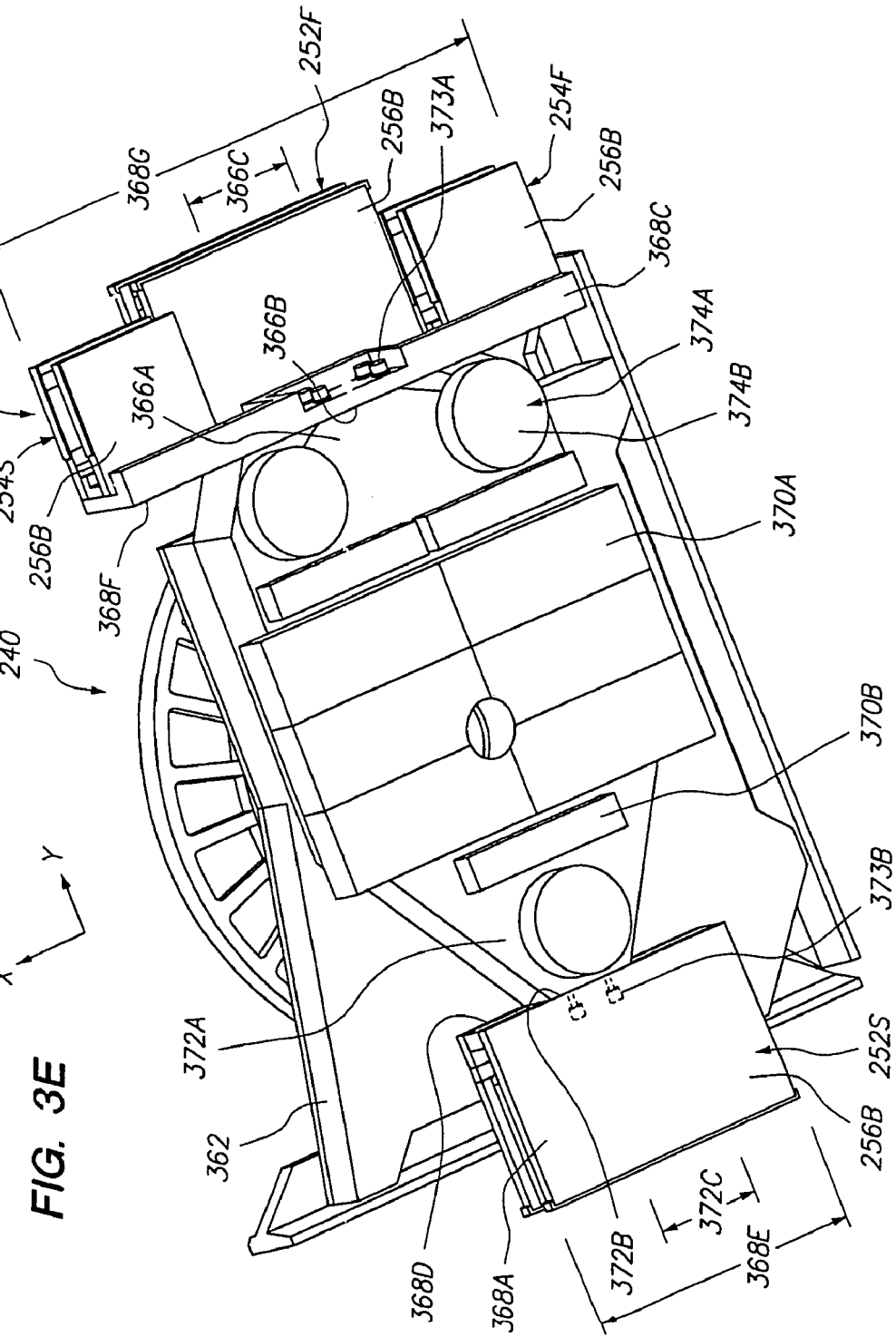
FIG. 3E is a bottom perspective of a portion a stage assembly.

FIG. 3E is a perspective bottom view of the second stage 240, and a portion of the second mover assembly 244. FIG. 3E illustrates that the second stage 240 includes one or more balance weights 370A, and one or more stops 370B that are fixedly secured to the table 362. The balance weights 370A are used to adjust the center of gravity (not shown) of the second stage 240. Accordingly, the number and location of the balance weights 370A can be varied to achieve the desired center of gravity. In one embodiment, one or more fasteners (not shown) are used to selectively each of the balance weights 370A and the stops 370B to the table 362.

The stops 370B provide a safe contact area for the second stage 240. With this design, when the Z movers 255 (not shown in FIG. 3E) are turned off, the stops 370B can engage the first stage 238 (not shown in FIG. 3E) to support the second stage 240. The design and number of the stops 370B can vary. In FIG. 3E, the second stage 240 includes three spaced apart, generally rectangular shaped stops 370B.

FIG. 3E illustrates that the left side of the table 362 defines a cantilevering, second necked region 372A that defines a second mounting surface 372B that is substantially opposite from the first mounting surface 366B. The first mounting surface 366B has a first surface length 366C and a first surface area. Similarly, the second mounting surface 372B has a second surface length 372C and a second surface area. In certain designs, the surface lengths 366C, 372C and the surface areas are relatively small. In alternative, non-exclusive embodiments, each surface length 366C, 372C is less than approximately 10, 20, 30, 40, 50 or 100 mm. Further, in alternative, non-exclusive embodiments, each surface area is less than approximately 5, 10, 20, 30, 40, or 50 $cm^2$.

A mover mounting surface 368D of the mover housing 368A of each X mover 252F, 252S has a housing length 368E and an attachment side area. In alternative, non-exclusive embodiments, each housing length 368E is greater than approximately 30, 50, 70, 100, 125, 150, 175, or 200 mm. Further, in alternative, non-exclusive embodiments, each attachment side area is greater than approximately 10, 20, 40, 50, 75, or 100 $cm^2$.

In certain embodiments, the housing length 368E of the second X mover 252S is greater than the second surface length 372C and the housing side area is greater than the surface area of the second mounting surface 372B. In alternative, non-exclusive embodiments, the housing length 368E of the second X mover 252S is at least approximately 20, 40, 60, 80, 100, 150, 200, 250, 300, 350, 400, 450, or 500 percent longer than the second surface length 372C. Further, in alternative, non-exclusive embodiments, the housing side area of the second X mover 252S is at least approximately 20, 40, 60, 80, 100, 200, 300, 400, 500, 600, 700, 800, 900, or 1000 percent larger than the surface area of the second mounting surface 372B. With this design, the second mover component 256B of the second X mover 252S cantilevers away from the second necked region 372A of the table 362.

It should be noted that temperature changes in the second mover component 256B of the second X mover 252S can cause deformation, e.g. a change in length or bending of the second mover component 256B. The temperature changes can be caused by heat from the coils of the second X mover 252S, and thermal radiation. Because of the relatively small second surface length 372C, and the gap between the second mover component 256B and the second necked region 372A of the table 362, the effects of deformation of the second mover component 256B are reduced.

Somewhat similarly, a mover mounting surface 368F of the mounting bracket 368C has a bracket length 368G and a bracket surface area. In alternative, non-exclusive embodiments, the bracket length 368G is greater than approximately 50, 100, 150, 200, 250, or 300 mm. Further, in alternative, non-exclusive embodiments, the bracket surface area is greater than approximately 10, 20, 40, 60, 80, 100, 120, or 150 $cm^2$.

In certain embodiments, the bracket length 368G is greater than the surface length 366C of the first mounting surface 366B and the bracket surface area is greater than the surface area of the first mounting surface 366B. In alternative, non-exclusive embodiments, the bracket length 368G is at least approximately 20, 40, 60, 80, 100, 150, 200, 250, 300, 350, 400, 450, or 500 percent longer than the surface length 366C of the first mounting surface 366B. Further, in alternative, non-exclusive embodiments, the bracket surface area is at least approximately 20, 40, 60, 80, 100, 200, 300, 400, 500, 600, 700, 800, 900, or 1000 percent bigger than the surface area of the first mounting surface 366B. With this design, the mounting bracket 368C with the second mover component 256B of the movers 252F, 254F, 254S cantilever away from the first necked region 366A of the table 362.

It should be noted that temperature changes in the second mover component 256B of the first X mover 252F and the Y movers 254F, 254S can cause deformation, e.g. bending of the mounting bracket 368C. Because of the relatively small first surface length 366C, effects of deformation of the mounting bracket 368C are reduced.

In one embodiment, the second stage 240 also includes (i) a first fastener assembly 373A for selectively securing the mounting bracket 368C with the second mover components 256B of the first X mover 252F and the Y movers 254F, 254S to the first mounting surface 366B, and (ii) a second fastener assembly 373B (illustrated in phantom) for selectively securing the mover housing 368A of the second X mover 252S to the second mounting surface 372B. In FIG. 3B, each fastener assembly 373A, 373B includes four fasteners 373C that can be selectively threaded into the table 362 at the respective mounting surfaces 366B, 372B. Alternatively, each fastener assembly 373A, 373B can include more than four or less than four fasteners 373C. With this design, the second mover components 256B of the X movers 252F, 252S and the Y movers 254F, 254S can be easily replaced. This leads to a modular type design where different types of movers can be readily changed on the stage assembly. Stated in another fashion, with this design, the movers of the second mover assembly 224 can easily be reconfigured.

It should be noted that in one embodiment, the second mover component 256A of the first X mover 252F is positioned above the center of gravity of the second stage 240 and the and the second mover component 256A of the second X mover 252S is positioned below the center of gravity of the second stage 240. Further, the X movers 252F, 252S are positioned to direct a net force through the center of gravity of the second stage 240.

FIG. 3E also illustrates that the table 362 includes one or more table pads 374A that interact with the stage bearing assembly 257 (illustrated in FIG. 2D). The number, location, size and shape of table pads 374A can vary. In this embodiment, the table 362 includes three spaced apart table pads 374A. Further, each table pad 374A is generally hollow disk shaped and includes a generally flat bearing surface 374B that faces the Z movers 255.

Figure 3F:
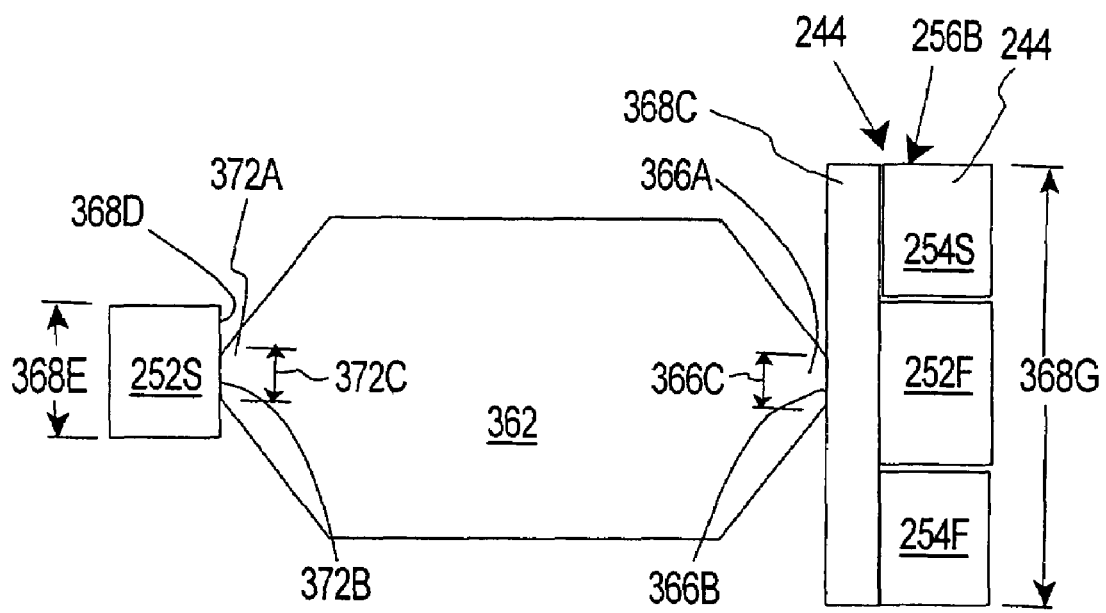
FIG. 3F is a simplified illustration of a portion of a stage assembly.

FIG. 3F is a simplified illustration of a portion of the table 362 and a portion of the second mover components 256B of the second mover assembly 244. In this illustration, many of the surface features of the table 362 have been removed. In particular, this illustration highlights the first necked region 366A and the second necked region 372A of the table 362.

FIG. 3F also illustrates that the second mover component 256B of the first X mover 252F, and the Y movers 254F, 254S are secured to the right side of the table 362, and the second mover component 256B of the second X mover 252S is secured to the left side of the table 362. The mounting bracket 368C secures the mover housing 368A of the first X mover 252F, and the Y movers 254F, 254S to the table 362.

FIG. 3F also highlights the relationship between (i) the first surface length 366C of the first mounting surface 366B and the bracket length 368G of the mounting bracket 368C, and (ii) the second surface length 372C of the second mounting surface 372B and the housing length 368E of the mover mounting surface 368D.

Figure 3G:
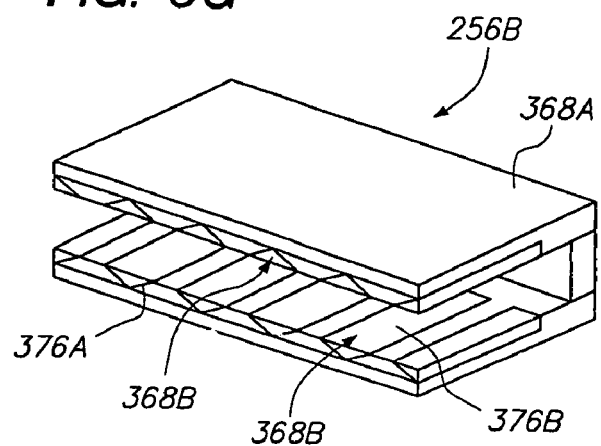
FIG. 3G is a perspective view of a portion of an X mover.

FIG. 3G is a perspective view of the second mover component 256B of one of the X movers 252F, 252S including the mover housing 368A and the spaced apart magnet arrays 368B. In this embodiment, each of the magnet arrays 368B includes a plurality of magnets 376B that each has a triangular shaped cross-section. Moreover, the mover housing 368A can be made of a ceramic material.

Figure 3H:
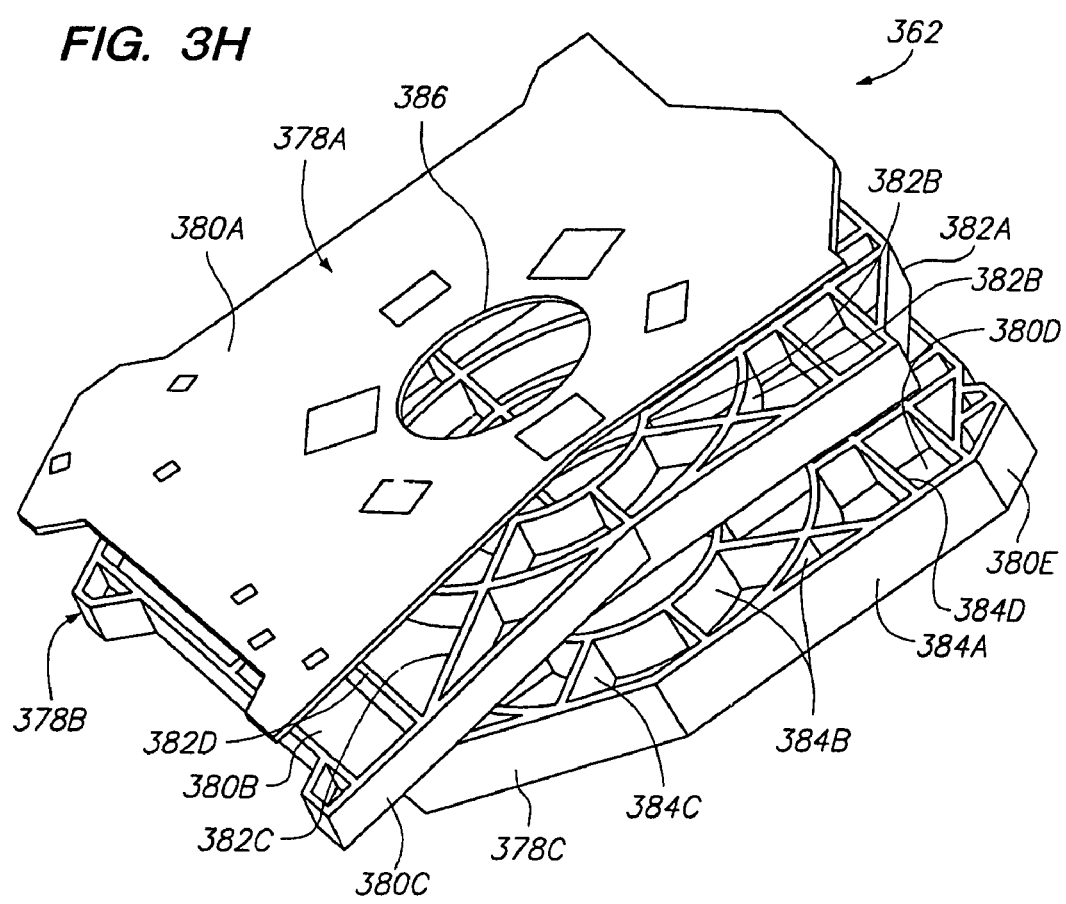
Figure 31:
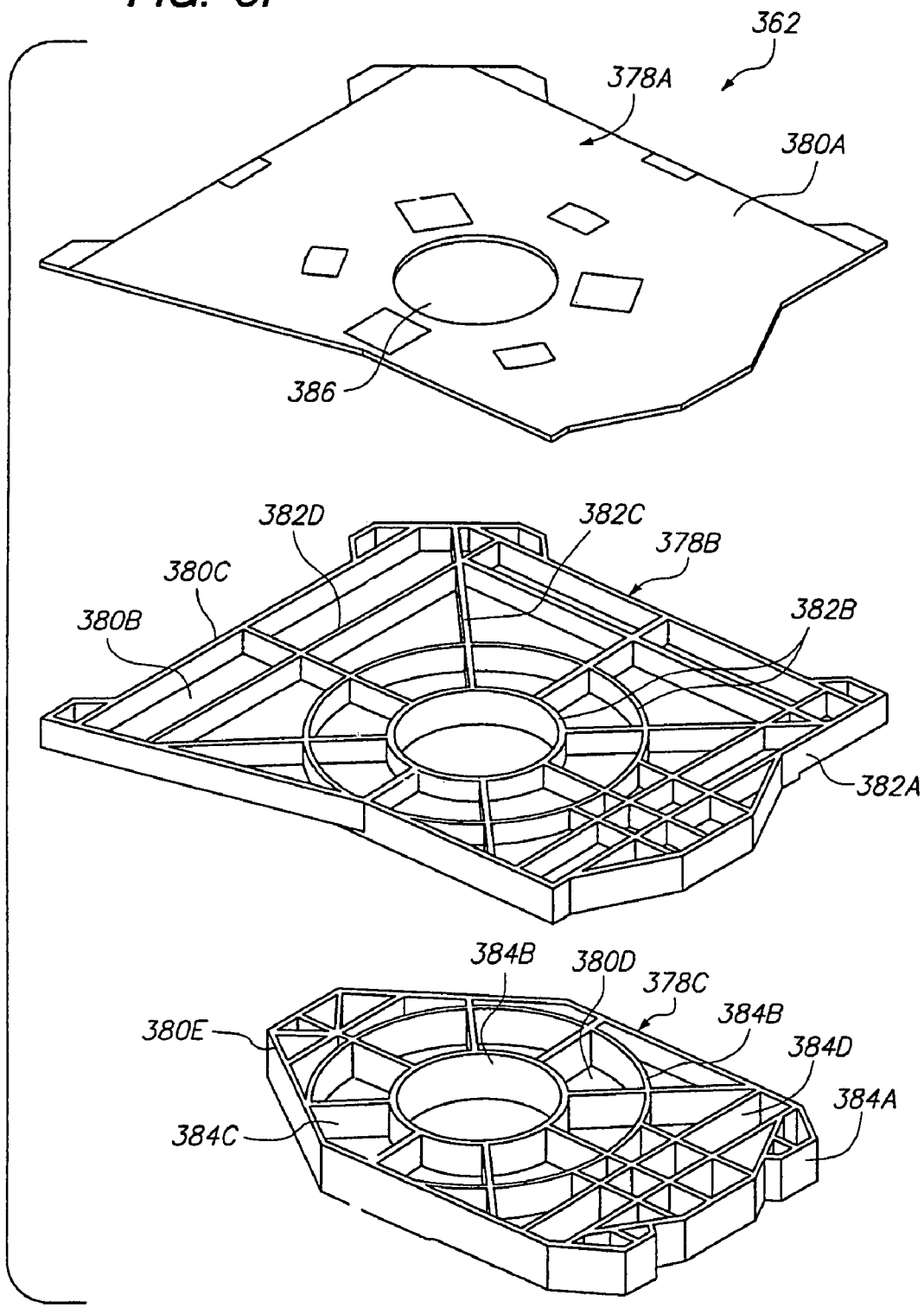

FIGS. 3H and 3I are alternative, exploded perspective views of one embodiment of the table 362. In this embodiment, the table 362 includes an upper first table section 378A, an intermediate second table section 378B that is fixedly secured to the bottom of the first table section 378A, and a lower third table section 378C that is fixedly secured to the bottom of the second table section 378B. Alternatively, the table 362 could be designed with fewer than three or more than three table sections. With this design, the sections of the table 362 can be designed to achieve the desired characteristics of the table 362.

The design of each table section 378A, 378B, 378C can vary. In FIGS. 3H and 3I, the first table section 378A includes a generally flat plate shaped upper plate 380A. The second table section 378B includes a generally flat plate shaped intermediate plate 380B and a plurality of intermediate walls 380C that extend transversely to and cantilever upward from the intermediate plate 380B. Somewhat similarly, the third table section 378C includes a generally flat plate shaped lower plate 380D and a plurality of lower walls 380E that extend transversely to and cantilever upward from the lower plate 380D.

The shape, positioning, and number of walls 380C, 380E can be varied to achieve the desired stiffness, weight, and vibration characteristics of the table 362. In this embodiment, the intermediate walls 380C include an outer rectangular shaped perimeter wall 382A, two, coaxial tubular shaped walls 382B, a plurality of radial walls 382C that extend radially from the inner ring towards the outer perimeter, and three, spaced apart cross-brace walls 382D. Somewhat similarly, in this embodiment, the lower walls 380E include an outer rectangular shaped perimeter wall 384A, two, coaxial tubular shaped walls 384B, a plurality of radial walls 384C that extend radially from the inner ring towards the outer perimeter, and three, spaced apart cross-brace walls 384D.

In certain non-exclusive embodiments, one or more of the walls has a thickness of approximately 1, 2, 5, 7, 10, 15 or 20 mm.

The table sections 378A, 378B, 378C can be fixed together with an adhesive, fasteners, welds, brazing, or other suitable fashion. In one embodiment, at least one of the table sections 378A, 378B, 378C is made of a ceramic material. With the sections 378A, 378B, 378C secured together, the table 362 defines a plurality of spaced apart cavities.

In should be noted that the table 362 illustrated in FIGS. 3H and 3I is a box type structure that includes a plurality of walls that are positioned therein to provide a lightweight table 362 that is very stiff. This table 362 also includes an aperture 386 that facilitates replacement of the work piece.

In one embodiment, the table 362 is approximately 350 mm by 450 mm by 40 mm thick. Further, in alternative non-exclusive embodiments, the table 362 has a mass of less than approximately 7, 6.5, 6, 5.8, 5.5 or 5 kg. Moreover, in alternative non-exclusive embodiments, the table 362 has a first vibration frequency of at least approximately 500, 600, 700, 800, or 1000 HZ.

Figure 3J:
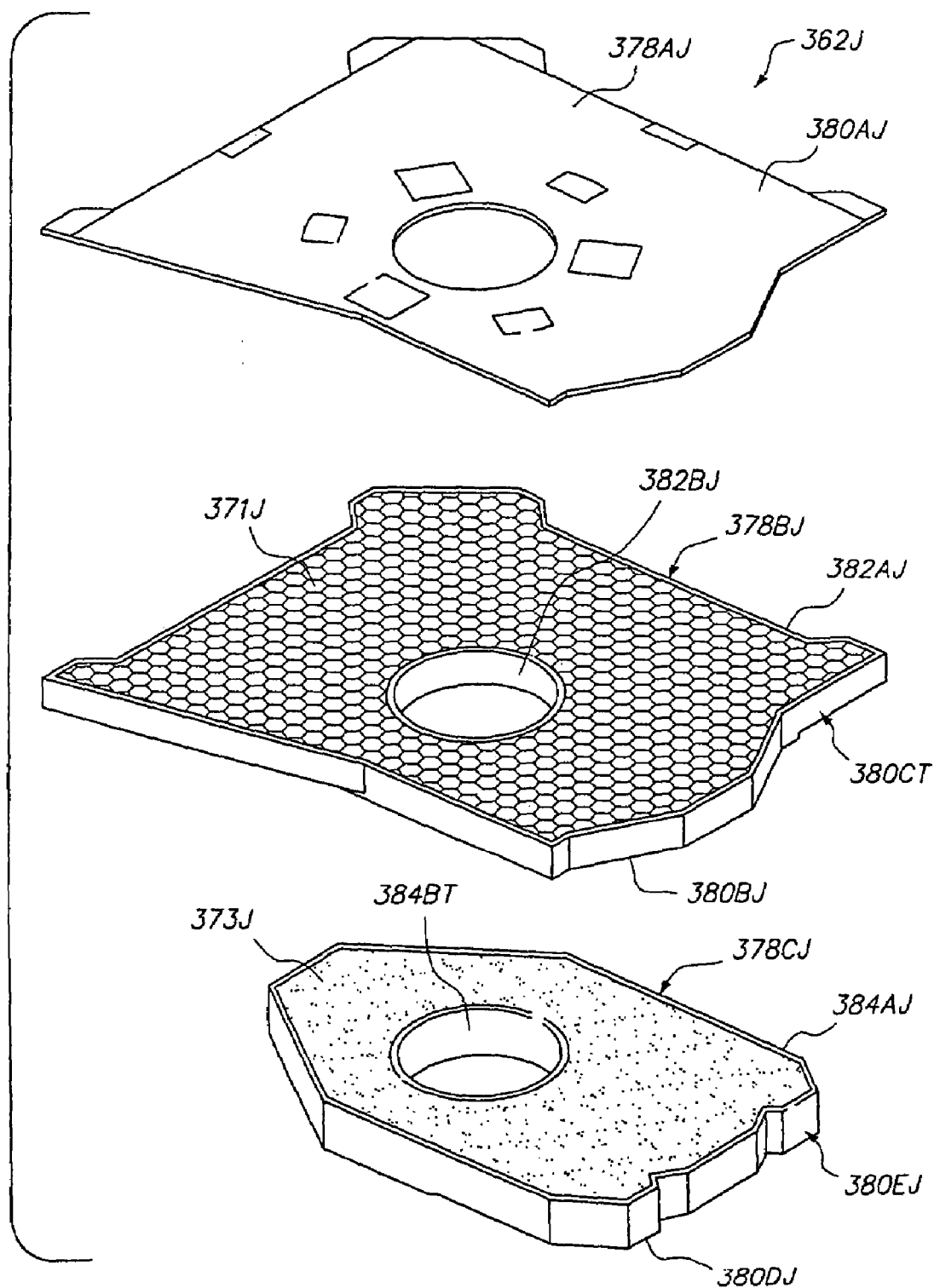
FIG. 3J is an exploded perspective view of yet another embodiment of a table.

FIG. 3J is an exploded perspective view of yet another embodiment of a table 362J. In this embodiment, the table 362J includes an upper first table section 378AJ, an intermediate second table section 378BJ that is fixedly secured to the bottom of the first table section 378AJ, and a lower third table section 378CJ that is fixedly secured to the bottom of the second table section 378BJ. Alternatively, the table 362J could be designed with fewer than three or more than three table sections.

In FIG. 3J, the first table section 378AJ includes a generally flat plate shaped upper plate 380AJ. The second table section 378BJ includes a generally flat plate shaped intermediate plate 380BJ and a plurality of intermediate walls 380CJ that extend transversely to and cantilever upward from the intermediate plate 380BJ. Somewhat similarly, the third table section 378CJ includes a generally flat plate shaped lower plate 380DJ and a plurality of lower walls 380EJ that extend transversely to and cantilever upward from the lower plate 380DJ.

In this embodiment, the intermediate walls 380CJ include an outer perimeter wall 382AJ, and a tubular shaped inner wall 382BJ. Somewhat similarly, in this embodiment, the lower wall 380EJ includes an outer perimeter wall 384AJ and a tubular shaped inner wall 384BJ.

In one embodiment, one or more of the table sections 378AJ, 378BJ, 378CJ includes a honeycomb type structure 371J and/or a foam material 373J. In FIG. 3J, the intermediate second table section 378BJ includes a honeycomb type structure 371J positioned between the intermediate walls 380CJ, and the lower third table section 378CJ includes a foam material 373J positioned between the lower walls 380EJ. Examples of a honeycomb type structure 371J includes a plurality of very thin walls that can be made of a number of materials such as aluminum, cardboard, fiber reinforced plastic. Examples of a foam material 373J include a polymer foam.

Figure 4A:
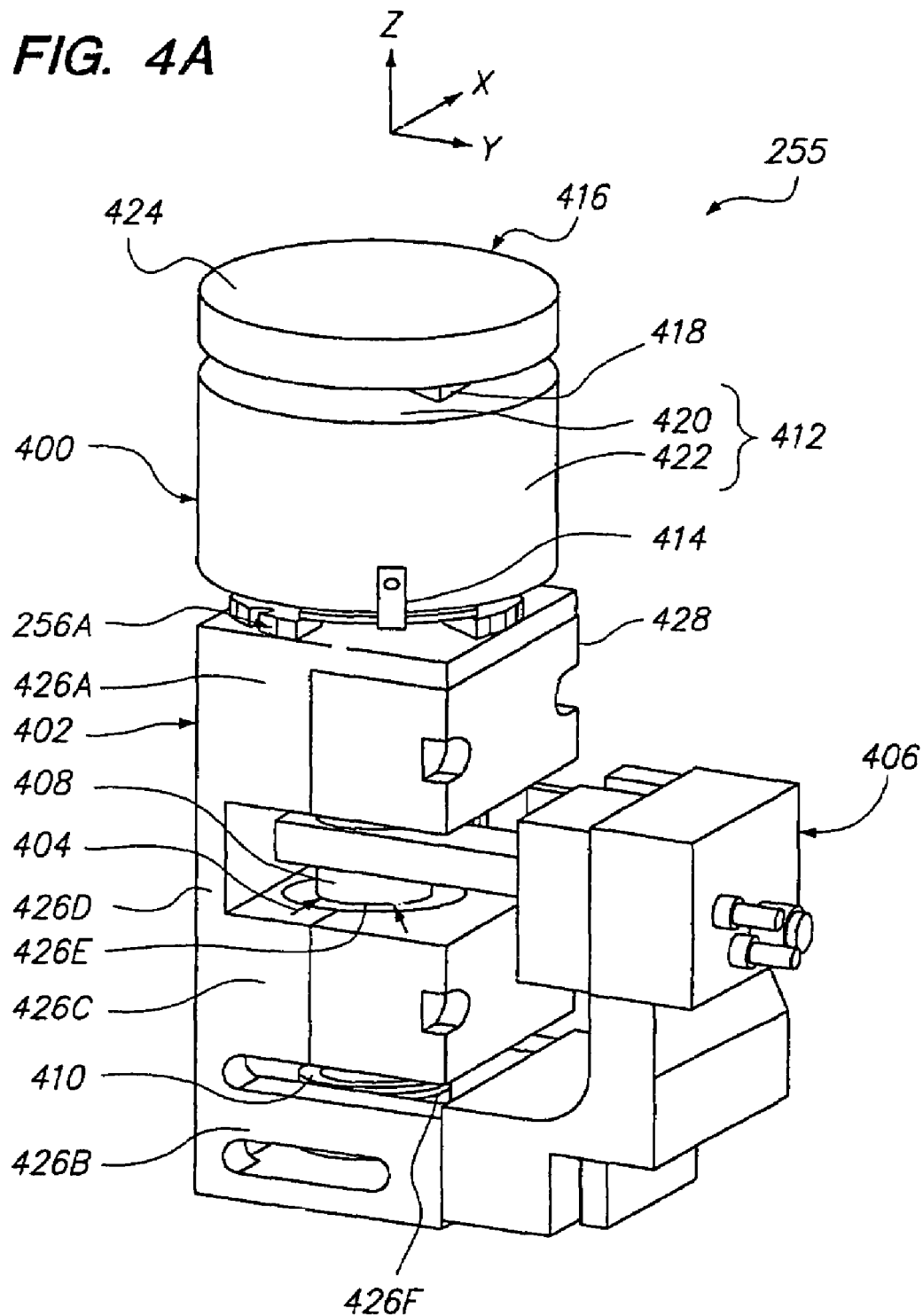
FIG. 4A is a perspective view of a Z mover.

FIG. 4A is a perspective view of one embodiment of a Z mover 255 suitable for use with the present invention. In this embodiment, the Z mover 255 includes a Z output assembly 400, a Z frame 402, Z bearing 404 (illustrated as arrows), a Z measurer 406, the first mover component 256A and the second mover component 256B (illustrated in FIG. 4B). The design of each of these components can be varied to suit the design requirements of the Z mover 255.

The Z output assembly 400 is moved relative to the Z frame 402 along the Z axis. In one embodiment, the Z output assembly 400 includes a Z beam 408, a Z dampener 410, a Z housing 412, one or more housing supports 414, a Z mover output 416, and a connector assembly 418. In FIG. 4A, the Z beam 408 is rigid and extends through a portion of the Z frame 402. The Z beam 408 also supports a portion of the second mover component 256B.

The Z dampener 410 is secured to the bottom of the Z beam 408 and secures the bottom of the Z beam 408 to the Z frame 402. In one embodiment, the Z dampener 410 supports the weight of the Z beam 408, allows the Z beam 408 to move relative to the Z frame 402, and inhibits vibration (including along the Z axis) from the first stage (not shown in FIG. 4A) from being transmitted to the Z beam 408 and the second stage (not shown in FIG. 4A). As a result thereof, the Z mover 255 has a relatively low transmissibility of vibration. Stated in another fashion, the Z dampener 410 can reduce the level of vibration that would otherwise be transferred from the first stage to the second stage. In alternative, non-exclusive embodiments, the Z dampener 410 can reduce the level of vibration that would otherwise be transferred to the second stage by at least approximately 1, 5, 10, 20, 30, 40, 50, 60, 70, 80, 90, 99 or 100 percent.

The Z housing 412 supports a portion of the second mover component 256B. In FIG. 4A, the Z housing 412 includes a flat top section 420 and an annular cylindrical section 422. In one embodiment, the Z housing 412 encircles the mover components 256A, 256B.

The one or more housing supports 414 connect the Z housing 412 to the Z beam 408 and allow a portion the first mover component 256A to extend below the Z housing 412 and be secured to the top of the Z frame 402.

The Z mover output 416 is generally flat disk shaped and includes a generally flat, top bearing surface 424 that faces the table (not shown in FIG. 4A).

The connector assembly 418 mechanically and flexibly connects the bottom of the Z mover output 416 to the top of the Z housing 412. As a result thereof, movement of the Z housing 412 along the Z axis results in movement of the Z mover output 416. The design of the connector assembly 418 can be varied pursuant to the teachings provided herein. In one embodiment, the connector assembly 418 includes a flexure that extends between the Z mover output 416 and the Z housing 412. As used herein, the term "flexure" shall mean a part that has relatively high stiffness in some directions and relatively low stiffness in other directions. In FIG. 4A, the flexure has (i) a relatively high stiffness along the X, Y and Z axes and about the Z axis and (ii) is relatively flexible about X and Y axes. The ratio of relatively high stiffness to relatively low stiffness is at least approximately 100/1, and can be at least approximately 1000/1.

With this design, movement of the Z housing 412 along the Z axis results in movement of the Z mover output 416 along the Z axis. However, the connector assembly 418 allows the Z mover output 416 to tilt and pivot about the X axis and about the Y axis relative to the Z housing 412. It should be noted that other designs for the connector assembly 418 can be utilized.

The Z frame 402 supports the Z output assembly 400 and supports the first mover component 256A. The size, shape and design of the Z frame 402 can be varied. In FIG. 4A, the Z frame 402 is generally "E" shaped and includes an upper bar section 426A, a lower bar section 426B, an intermediate bar section 426C positioned between the upper bar section 426A and the lower bar section 426B and a rear bar section 426D that connects upper, intermediate, and lower bar sections 426A, 426B, 426C together. In FIG. 4A, the upper bar section 426A and the intermediate bar section 426C include an aperture 426E for receiving the Z beam 408 and the lower bar section 426B includes a slot 426F for receiving a portion of the Z beam 408. Moreover, the upper bar section 426A and the intermediate bar section 426C each include a selectively removable section 428 that facilitates placement of Z beam 408 in the Z frame 402.

The lower bar section 426B is fixedly secured to the top of the first stage 238. Further, the first mover component 256A is fixedly secured to the upper bar section 426A.

The Z bearing 404 guides the movement of the Z beam 408 relative to the Z frame 402. In one embodiment, the Z bearing 404 allows for the movement of the Z beam 408 along the Z axis (pure vertical movement) and inhibits movement of the Z beam 408 relative to the Z frame 402 and the first stage along the X and Y axes, and about the X and Y axes. In one embodiment, the Z bearing 404 is a non contact type bearing, such as a fluid type bearing, or a magnetic type bearing between the intermediate bar section 426C and the Z beam 408. With the non contact type bearing, the Z beam 408 can be moved along the Z-axis with little to no friction.

The Z measurer 406 measures the movement of the Z beam 408 relative to the Z frame 402. The Z measurer 406 detects position of the Z beam 408 relative to the Z frame 402 (the first stage 238) in the Z direction. In one embodiment, this information substantially corresponds to the movement (extension and shrinkage) of the Z dampener 410 such as an air bellows along the Z axis. In the embodiment illustrated in FIG. 4A, the Z measurer 406 is a linear encoder. Information regarding the movement of the Z beam 408 can be directed to the control system 24 (illustrated in FIG. 1) so that the control system 24 can control the Z mover 255. Alternatively, for example, the Z measurer 406 can be a capacitance gauge or another type of sensor.

Additionally, as discussed in more detail below, in certain designs, information from the Z measurer 406 can be used to reduce the level of vibration that is being transferred from the first stage to the second stage. Moreover, in certain designs, information from the Z measurer 406 can be used in the initialization of the measurement system.

FIG. 4B is a cut-away perspective view and FIG. 4C is a cut-away plan view of the Z output assembly 400 and the second mover component 256B. In this embodiment, the Z beam 408 is generally tubular shaped.

In FIGS. 4B and 4C, the Z dampener 410 is a fluid bellows that includes (i) a top that is secured to the bottom of the Z beam 408 and (ii) a bottom that is fixedly secured to the Z frame 402 (illustrated in FIG. 4A). With this design, the Z dampener 410 inhibits rotation of the Z output assembly 400 about the Z axis. The pressure of the fluid in the fluid bellows can be adjusted to suit the needs of the Z dampener 410. In one embodiment, the fluid pressure is set in the fluid bellows and not changed. Alternatively, for example, the fluid pressure could be adjusted and controlled with a fluid source (not shown). In yet another embodiment, the Z dampener 410 can be a spring or another type of damping device.

FIGS. 4B and 4C also illustrate the second mover component 256B in more detail. In this embodiment, the second mover component 256B includes a tubular shaped outer magnet 430A that is secured to the inside of the Z housing 412, and a spaced apart, coaxial tubular shaped inner magnet 430B. The bottom of the inner magnet 430B is secured to the top of the Z beam 408 and the top of the inner magnet 430B is secured to the bottom of the top section 420 of the Z housing 412.

FIGS. 4B and 4C also illustrate that the housing supports 414 extend between the top of the Z beam 408 and the bottom of the Z housing 412.

FIG. 4D is an enlarged, cut-away view of a portion of the Z output assembly 400, the first mover component 256A and the second mover component 256B. In this embodiment, the first mover component 256A includes a tubular shaped coil 432A that is positioned between and coaxial with the magnets 430A, 430B, and a plurality of spaced apart feet 432B that extend downward from the coil 432A between the spaced apart housing supports 414. The feet 432B are used for fixedly securing the coil 432A to the Z frame (not shown in FIG. 4D). With this design, current to the coil 432A causes the magnets 430A, 430B and the Z output assembly 400 to move along the Z axis. Arrows 433 illustrate the orientation of the magnets.

FIG. 4D also illustrates the flexure 418 in more detail. More specifically, in this embodiment, the flexure 418 includes (i) an upper disk shaped region 434A that is secured to the bottom of the Z mover output 416, (ii) a lower disk shaped region 434B that is secured to the top of the Z housing 412, and (iii) a pair of spaced apart flexible connector strips 434C that connect the regions 434A, 434B together.

Figure 5:
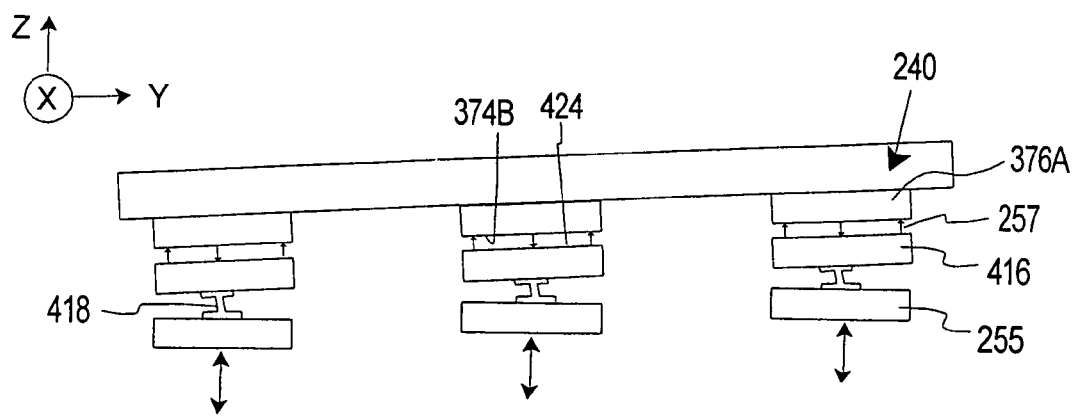
FIG. 5 is a simplified illustration of a portion of the stage assembly.

FIG. 5 is a simplified illustration of the relationship between the second stage 240, a portion of the three Z movers 255, and the stage bearing assembly 257 (illustrated as arrows) with the second stage 240 tilted. In particular, FIG. 5 illustrates that (i) each of table pads 376A is aligned with the mover output 416 of one of the Z movers 255, (ii) the stage bearing assembly 257 maintains the table pads 376A spaced apart from the mover outputs 416, and (iii) the connector assembly 418 allows each of the mover outputs 416 to pivot relative to the rest of the Z mover 255. As a result thereof, the mover outputs 416 pivot so that the bearing surface 374B of the table pads 376A is substantially parallel with the bearing surface 424 of the mover output 416 during pivoting of the second stage 240. It should be noted that the pure Z motion from the Z movers 255 along the Z axis can be used to tilt the second stage 240.

Figure 6A:
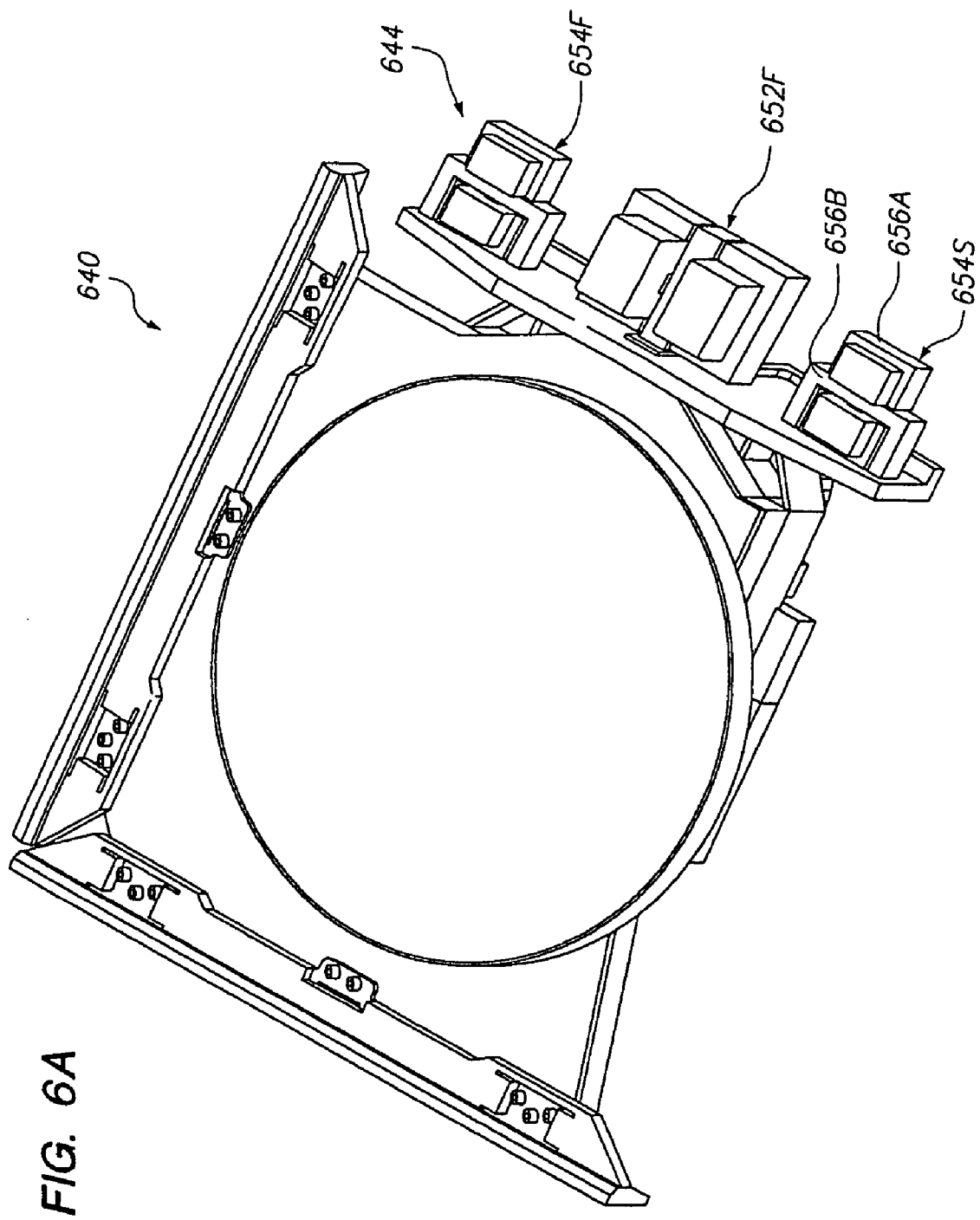
FIG. 6A is a top perspective of another embodiment of a portion a stage assembly.

FIG. 6A is a top perspective view and FIG. 6B is a bottom perspective view of a second stage 640 with another embodiment of the second mover assembly 644. The second mover assembly 644 includes a first X mover 652F, a second X mover 652S, a first Y mover 654F, and a second Y mover 654S. In this embodiment, the second stage 640 is similar to the second stage 240 described above. However, in this embodiment, the X and Y movers 652F, 652S, 654F, 654S of the second mover assembly 644 are different.

In this embodiment, each of the X and Y movers 652F, 652S, 654F, 654S is an attraction only type actuator, such as an E-I Core actuator. An example of the E-I core actuator is described in U.S. Pat. No. 6,069,471, which is incorporated herein by reference in its entirety. In this embodiment, each of the first mover components 656A includes a pair of E cores and tubular conductors that are secured to the first stage (not shown in FIGS. 6A and 6B) and the second mover component 656B is an I core that is secured to the second stage 640.

It should be noted that the X and Y movers 652F, 652S, 654F, 654S are secured to the second stage 640 in a fashion that is similar to how the X and Y movers 252F, 252S, 254F, 254S are secured to the second stage 240 described above. This allows for a stage assembly that can readily be reconfigured with different types of movers.

Figure 7B:
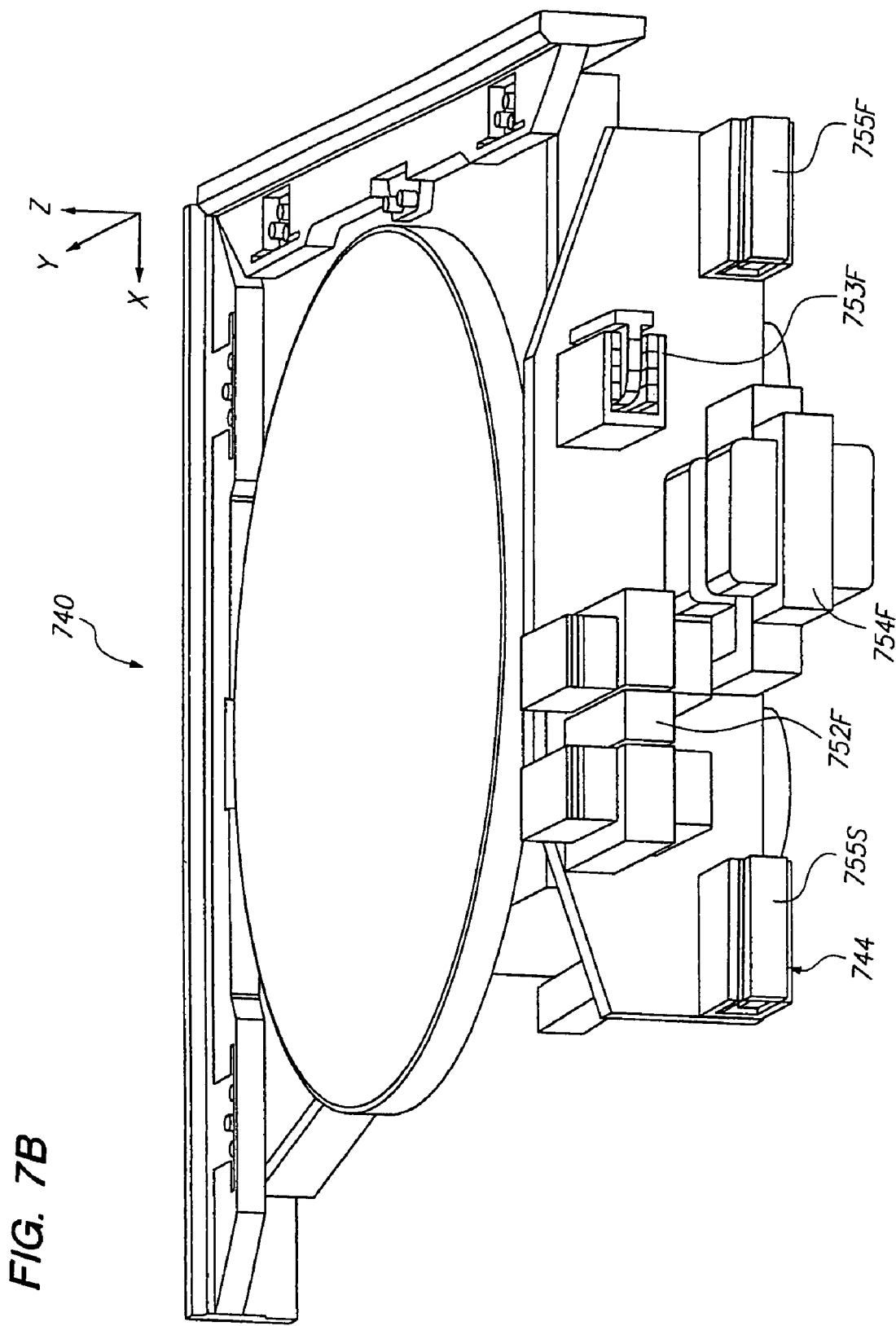
FIG. 7B is a side perspective of the portion of the stage assembly of FIG. 7A.

FIG. 7A is a top perspective view and FIG. 7B is a side perspective view of a second stage 740 with another embodiment of the second mover assembly 744. In this embodiment, the second stage 740 is similar to the second stage 240 described above. However, in this embodiment, the second mover assembly 744 includes a first pair of X movers 752F (only one is shown), a second pair of X movers 753F (only one is shown), a first Y movers 754F, and a second pair of Y movers 755F, 755S.

In this embodiment, (i) each of the X movers 752F of the first pair is an E-I core actuator, (ii) each of the X movers 753F of the second pair is a voice coil motor, (iii) the Y mover 754F is an E-I core actuator, and (iv) each of the Y movers 755F, 755S of the second pair is a voice coil motor. With this design, for example, (i) the first pair of X movers 752F can be used for rapid, coarse movements of the second stage 740 along the X axis, (ii) the second pair of X movers 753F can be used for fine movements of the second stage 740 along the X axis, (iii) the Y mover 754F can be used for rapid, coarse movements of the second stage 740 along the Y axis, and (iv) the second pair of Y movers 755F, 755S can be used for fine movements of the second stage 740 along the Y axis and about the Z axis.

It should be noted that the X and Y movers 752F, 753F, 754F, 755F, 755S are secured to the second stage 740 in a fashion that is similar to how the X and Y movers 252F, 252S, 254F, 254S are secured to the second stage 240 described above. This allows for a stage assembly that can readily be reconfigured.

Figure 8:
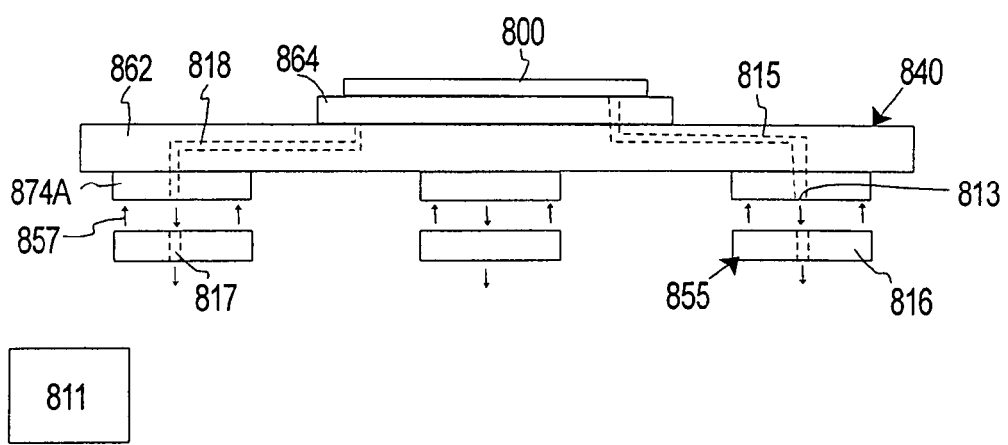
FIG. 8 is a simplified illustration of another embodiment of portion of a stage assembly.

FIG. 8 is a simplified illustration of (i) a work piece 800, (ii) a second stage 840 including a table 862, a chuck 864, and three table pads 874A, (iii) a Z mover output 816 of the three Z movers 855, and (iv) a stage bearing assembly 857. More specifically, FIG. 8 illustrates one embodiment of how a fluid at a pressure that is different than atmospheric pressure, e.g. a low pressure or a vacuum, from a fluid source 811 can be transferred from the fluid source 811 to the chuck 864.

In this embodiment, the stage bearing assembly 857 is vacuum preloaded fluid bearing. Further, two of the table pads 874A include an inlet port 813 that is in fluid communication with the chuck 864 via stage channels 815, 818 (illustrated in phantom). In one embodiment, each mover output 816 includes an outlet port 817 that is in fluid communication with the fluid source 811 and supplies vacuum to the stage bearing assembly 857.

With this design, the inlet port 813 is part of and moves with the second stage 840 and the outlet port 817 moves with the first stage. As a result thereof, the inlet port 813 is moved with six degrees of motion relative to the outlet port 817. Moreover, with this design, a portion of the vacuum created by the fluid source 811 to create the vacuum preloaded fluid bearing 857 can be diverted into table 862. Vacuum supplied by the stage channel 815 is directed to the chuck 864 to create the vacuum used by the chuck 864 to retain the work piece 800 to the chuck 864. Further, vacuum supplied by the stage channel 818 is directed through the table 862 to the chuck 864 to create the vacuum to retain the chuck 864 to the second stage 840. Further, with this design, the vacuum source 811 can be connected to the chuck 864 without a hose that extends from the fluid (vacuum) source 811 to the chuck 864. It should be noted that no fluid conduit, e.g. a hose or tube, extends between the inlet ports 813 and the outlet ports 817.

Figure 9A:
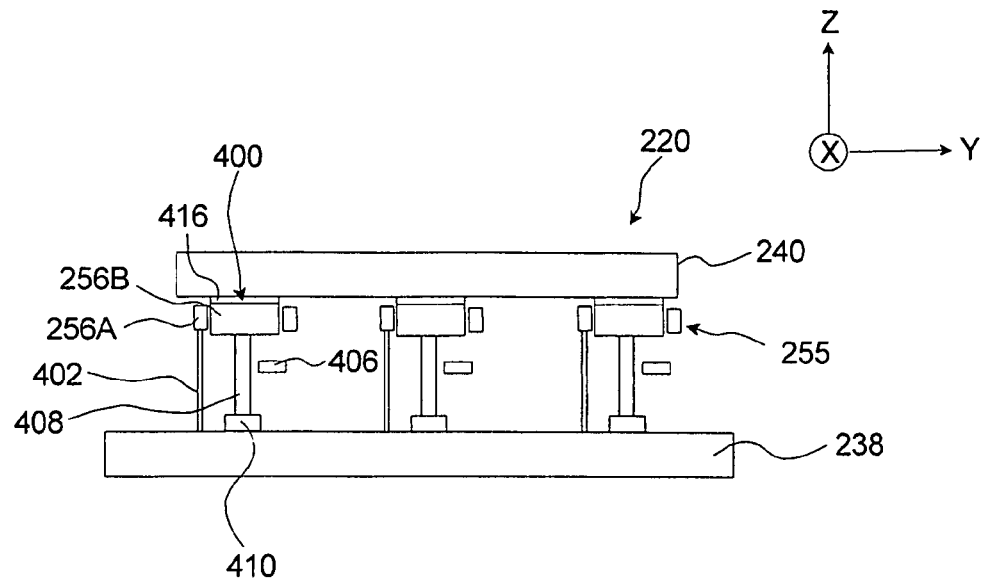
FIG. 9A is a simplified schematic of a portion of a stage assembly having features of the present invention.

FIG. 9A is a simplified illustration of a portion of the stage assembly 220 illustrated in FIGS. 2A-4D, including the first stage 238, the second stage 240, and the Z movers 255. In FIG. 9A, the Z output assembly 400, the Z frame 402, the Z measurer 406, the first mover component 256A and the second mover component 256B of each Z mover 255 is represented therein. Further, in FIG. 9A, the Z beam 408, the Z dampener 410, and the Z mover output 416 of each Z output assembly 400 is represented therein.

As discussed above, the Z dampener 410 is secured to the bottom of the Z beam 408 and couples the bottom of the Z beam 408 to the first stage 238. In one embodiment, the Z dampener 410 supports the weight of the Z beam 408 and of the second stage 240, allows the Z beam 408 to move relative to the first stage 238, and reduces the level of vibration from the first stage 238 that is being transmitted to the Z beam 408 and the second stage 240. It should be noted that each of the Z dampeners 410 has a stiffness. In non-exclusive embodiments, for example, each Z dampener 410 can have a stiffness (K) along the Z axis of approximately 0.1, 0.5, 1, 2, 5, 10, 15 or 20 N/mm.

As a result of the stiffness of the dampener 410, disturbances from the ground or environment that are transferred to the first stage 238 can still be at least partly transmitted to the second stage 240 via the dampener 410.

For each Z mover 255, the Z measurer 406 measures the movement and/or position of the Z beam 408 and a portion of the Z dampener 410 (e.g. the top) relative to the first stage 238 or some other reference. As discussed below, information regarding the movement of the Z beams 408 can be transferred to the control system 24 (illustrated in FIG. 1) so that the control system 24 can control the Z movers 255 to compensate for the stiffness and damping of the Z dampeners 410.

In certain embodiments, disturbances (e.g. from the ground or environment) that are transferred to the first stage 238 can cause a disturbance movement of the first stage 238 along the X, Y and Z axes and about the X, Y and Z axes. With the dampeners 410 illustrated in FIG. 9A, (i) the disturbance movement of the first stage 238 along the X and Y axes and about the Z axis is not transferred to the second stage 240, and (ii) the disturbance movement of the first stage 238 along the Z axis and about the X and Y axes results in a smaller displacement of a portion of the dampeners 410 and the Z beams 408 along the Z axis. The Z measurers 406 can be used to measure this displacement. Further, with this information, the velocity of that displacement can be calculated. As discussed below, using the displacement and velocity information, the control system 24 can control the Z movers 255 to compensate for the disturbances that are transferred through the dampeners 410.

In one embodiment, if the Z measurers 406 determine that movement of the first stage 238 has caused the Z beams 408 to move upward a displacement +d at a velocity of +v, the control system can direct power at the appropriate rates to the first mover components 256A to create downward forces on the Z beams 408 to counteract, correct and/or reduce undesired upward displacement of the Z beams 408. Similarly, if the Z measurers 406 determine that movement of the first stage 238 has caused the Z beams 408 to move downward a displacement −d at a velocity of −v, the control system 24 can direct power at the appropriate rates to the first mover components 256A to create upward forces on the Z beams 408 to counteract, correct and/or reduce undesired downward displacement of the Z beams 408. If the event that undesired displacement is entirely counteracted, the second stage 240 is isolated from the disturbance movement of the first stage 238.

Figure 9B:
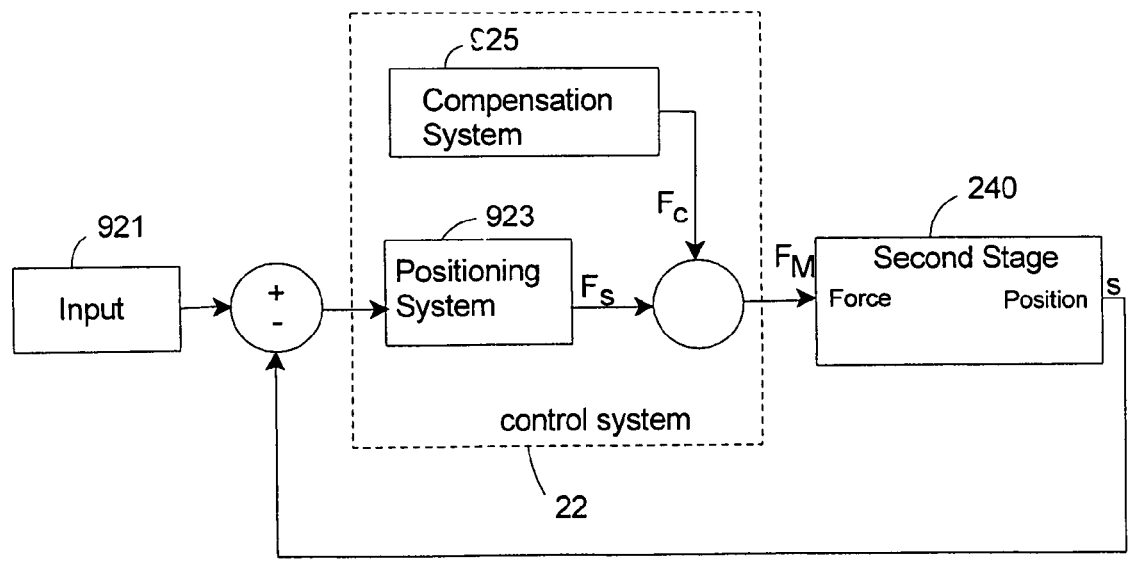
FIG. 9B is a simplified control diagram that illustrates the control function of a portion of the stage assembly of FIG. 9A.

FIG. 9B is a simplified block diagram that illustrates the control of the Z movers 255 of the second mover assembly 244 to precisely position the second stage 240 along the Z axis and about the X and Y axes. In this embodiment, the desired position of the second stage 240 is input 921 into the system. The desired position is compared with a sensor signal vector S of the second stage 240 that is generated by the measurement system 22. A difference vector is determined by comparing the input 921 to the sensor signal vector S. A control system 922 (control system 22) determines the power that is directed to the Z movers 255 to precisely position the second stage 240 along the Z axis.

In one embodiment, the control system 922 includes (i) a positioning system 923 that calculates the amount of power to be directed to the Z movers 255 needed to position the second stage 240, and (ii) a compensation system 925 that calculates the amount of power to be directed to the Z movers 255 needed to compensate for at least a portion of the stiffness and damping of the Z dampeners 410 and/or to reduce at least a portion of the level of vibration that is transmitted from the first stage 238 to the second stage 240 via the Z dampeners 410. The control system 922 can include PID (proportional integral derivative) controller, proportional gain controller or a lead-lag filter, or other commonly known law in the art of control, for example.

The power directed to the Z movers 255 creates a total mover force $F_M$ that is directed at the second stage 240. In one embodiment, the total mover force includes a servo force component $F_S$ and a compensation force component $F_C$. The servo force component $F_S$ is directed to the second stage 240 to position the second stage 240. The compensation force component $F_C$ is directed to the second stage 240 to offset and/or compensate for at least a portion of the stiffness of the Z dampener 410 and/or to reduce at least a portion of the level of vibration that is transmitted from the first stage 238 to the second stage 240 via the Z dampeners 410. Stated in another fashion, the compensation force component $F_C$ contains negative stiffness and negative damping terms to counteract the disturbance force $F_D$ (not shown) that is transferred from the first stage 238 through Z dampeners 410. When the compensation force component $F_C$ is approximately equal and opposite to the disturbance force $F_D$, the disturbance is counteracted and compensated for. In alternative, non-exclusive embodiments, the absolute value of the compensation force component $F_C$ is at least approximately 10, 20, 40, 50, 70, 80, 90, 99, 100, or 110 percent of the absolute value of the disturbance force $F_D$.

In certain designs, the performance of the Z movers 255 is relatively good, and the Z movers 255 have a stable, repeatable, linear stiffness, which can be canceled by the compensation force component $F_C$. In alternative, non-exclusive embodiments, the compensation force component $F_C$ is able to reduce the level of disturbance and/or vibration that would otherwise be is transmitted from the first stage 238 to the second stage 240 via the Z dampeners 410 by at least approximately 1, 5, 10, 20, 30, 40, 50, 60, 70, 80, 90, 99 or 100 percent.

For a one degree of freedom system, the dynamics of the movement of the second stage 240 relative to the first stage 238 can be summarized with the following equation:

$$Ma + Cv + Kd = F \quad \text{equation (1)}$$

Where M is the mass of the second stage 240, C represents the damping of the Z dampener 410, K represents the stiffness of the Z dampener 410, F is the force being imparted upon the second stage 240 along the one axis (e.g. the Z axis), a is the acceleration, v is velocity and d is displacement. When the information of the displacement and velocity is available, the Z movers 255 can be used to compensate for the stiffness (K) and damping (C) of the Z dampener 410. The information regarding the displacement and velocity of the Z beam 408 can be measured by the Z measurer 406.

$$\text{If } F = Cv + Kd + u \quad \text{equation (2)}$$

Where u is the servo Force component $F_S$ (the desired force). Combining equation (1) with equation (2) results in the following equation:

$$Ma = u \quad \text{equation (3)}$$

In one embodiment, it is desired that the displacement d to follow a trajectory command r, then u should be set as Ma:

$$Ma - Ma = 0 \quad \text{equation (4)}$$

Therefore, d should follow r.

For a more general 6 degree of movement system, the same techniques as can be utilized as for the one degree of movement system. The 6 degree of movement system dynamics can be written in the matrix form.

$$[M]qa - [C]qv + [K]qd = \underline{F} \quad \text{equation (5)}$$

Once the stiffness and damping matrices [K] and (C) for the system are calculated, the actuator forces needed to compensate for them can be calculated.

$$\underline{F} = [C]qv + [K]qd + \underline{u} \quad \text{equation (6)}$$

Equations (5) and (6) are in same form as equations (1) and (2). Accordingly, the same goal can be achieved in a 6 degree of movement system by using more generalized vectors and matrices.

Figure 9C:
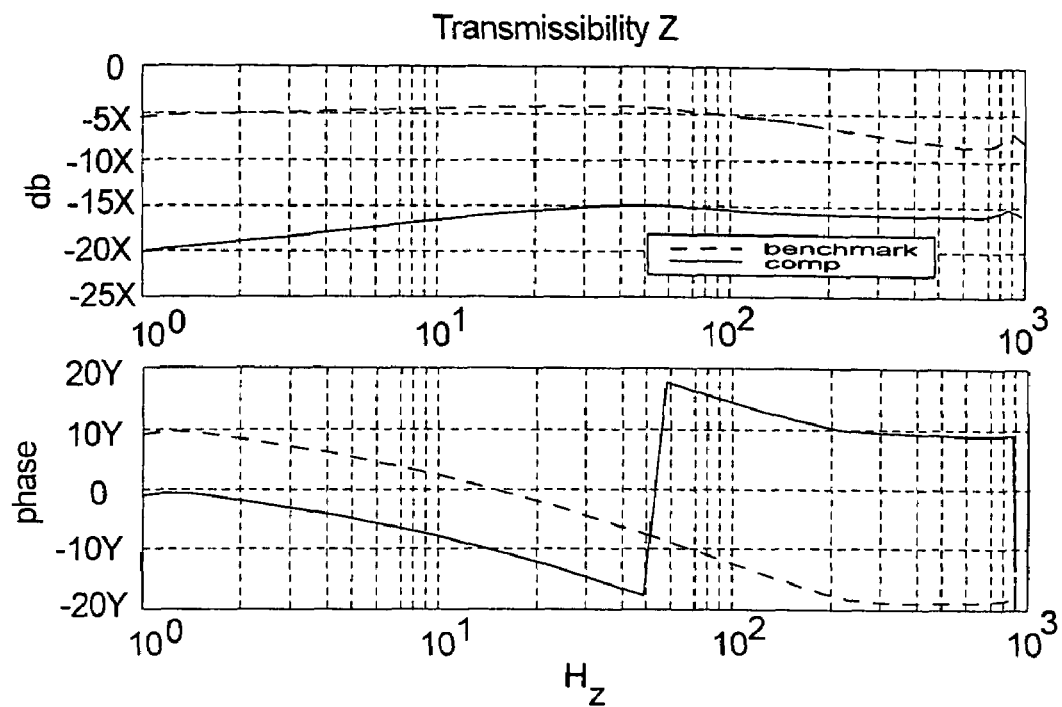
FIGS. 9C-9E are alternative graphs that illustrate simulated data regarding transmissibility compensation.
Figure 9D:
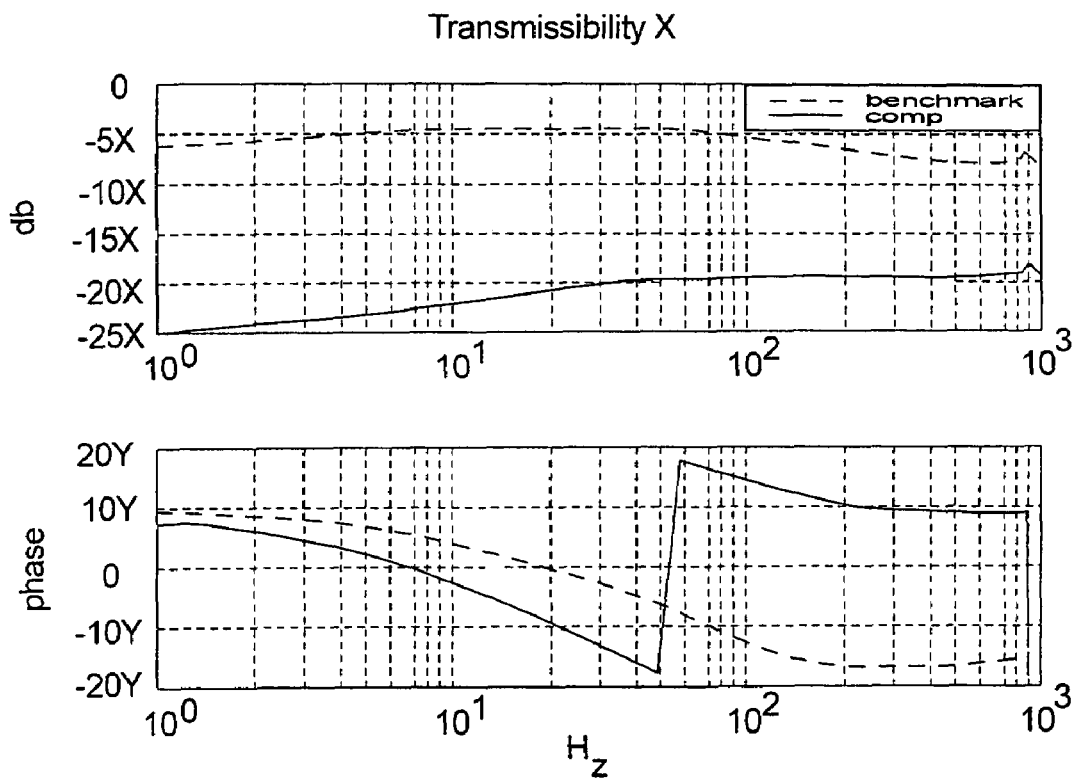
Figure 9E:
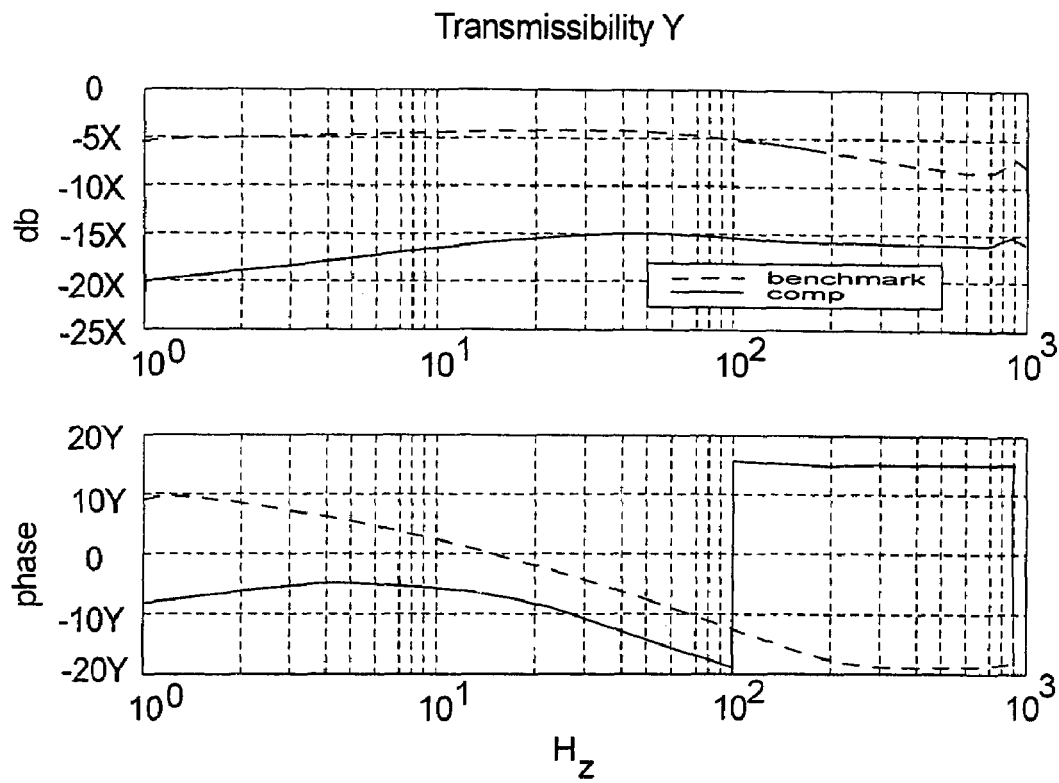

Simulated tests results were performed on a stage assembly that includes a first stage and a second stage. FIGS. 9C-9E are graphs that illustrate the simulated test results for transmissibility along the Z, along the X, and along the Y axis, respectively. Transmissibility is defined as the ratio of the displacement between the first stage and second stage across different frequencies. The simulation results show that the transmissibility dramatically reduced with the stiffness and damping compensation. FIGS. 9C to 9E illustrate Bode plots of transmissibility between the first stage and the second stage produced by a 6 degree of freedom simulation. If one hundred percent of the vibration is transmitted from the first stage to the second stage, the magnitude of the transmissibility would be 1.0, or 0 dB (on the top plot of each of FIGS. 9C-9E). To improve the positioning accuracy of the second stage, disturbances from the first stage are inhibited from being transferred to the second stage. In other words, the transmissibility is made as small as possible (a negative number in the magnitude (top) plot in FIGS. 9C-9E.)

FIGS. 9C-9E compare the transmissibility between two cases. The benchmark case (dashed line) is the performance when stiffness and damping compensation is not used. When compensation is active (the compensation case is illustrated with a solid line), the magnitude of the transmissibility is reduced, especially in low frequencies. In FIGS. 9C-9E, X can have a value of 1, 2, 5, 10, 20, 50 or 100 dB.

In one embodiment, the stiffness of each of the Z movers can be experimentally measured by controlling the Z movers to slowly move the second stage up and down. The measured stiffness can be used by the control system to quickly calculate the appropriate compensation force $F_c$. In one embodiment, for example, the second stage is moved up and down within a range of approximately 2 mm in approximately 0.5 seconds.

Figure 9F:
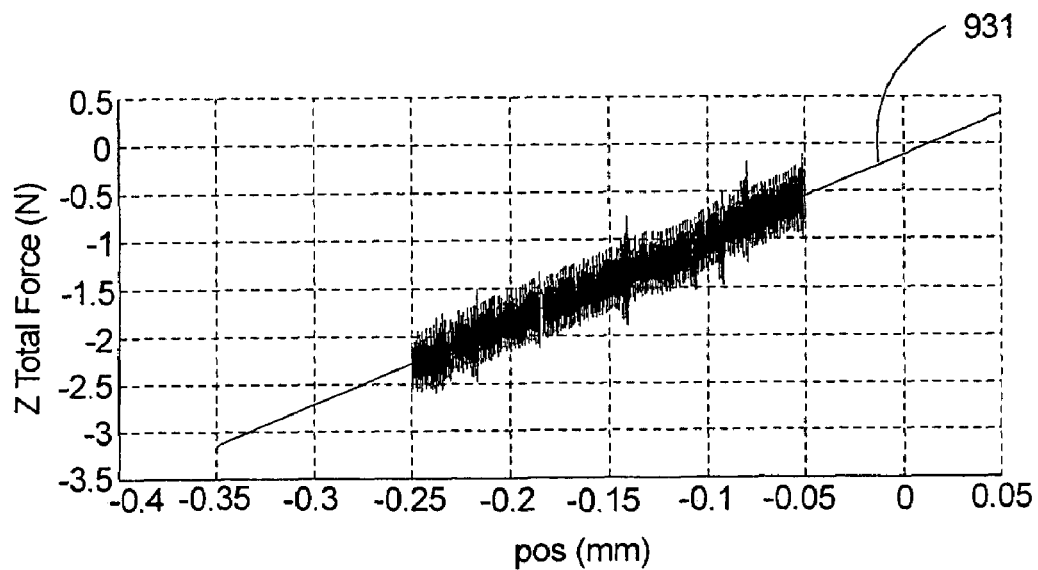
FIGS. 9F and 9G are graphs that illustrate the effect of stiffness compensation.

FIG. 9F is a graph that illustrates the test results for the total force applied by the Z movers versus the position of the second stage during a slow movement of the second stage with the Z movers. In FIG. 9F, line 931 represents the linear stiffness, which is the sum of the three stiffnesses of the three Z movers. In this embodiment, the stiffness is approximately 9 N/mm.

Figure 9G:
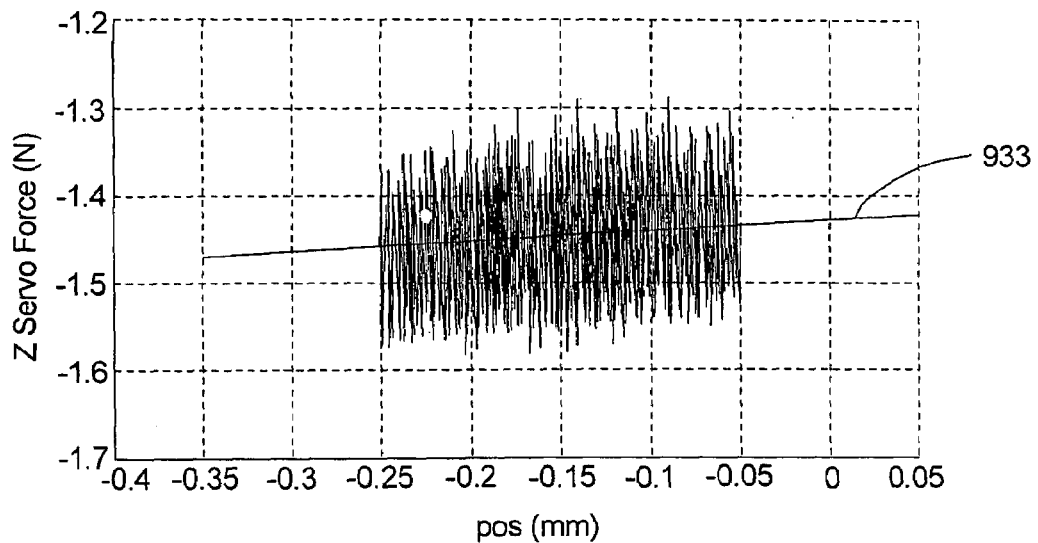

FIG. 9G is a graph that illustrates the effect of stiffness compensation for control to the Z movers. In FIG. 9G, line 933 represents the total stiffness acting on the center of gravity of the second stage. In this embodiment, the total stiffness acting on the second stage has been reduced to approximately 50 N/m.

Figure 10A:
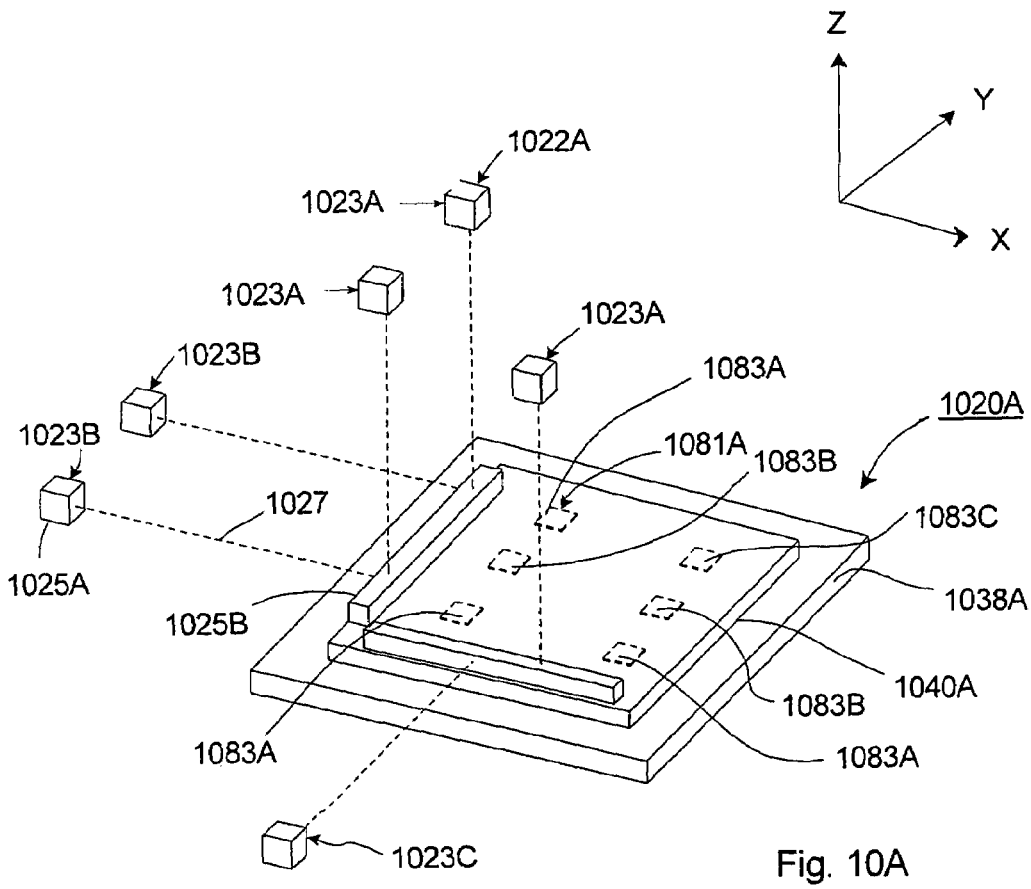
FIG. 10A is a simplified schematic of a yet another embodiment of a portion of a stage assembly having features of the present invention.

FIG. 10A is a simplified top perspective view of a portion of a stage assembly 1020A having features of the present invention. For example, the stage assembly 1020A can be used as the wafer stage assembly 20 or the reticle stage assembly 18 in the exposure apparatus 10 of FIG. 1. Alternatively, the stage assembly 1020A can be used to move other types of devices.

The components of the stage assembly 1020A that are illustrated in FIG. 10A include a first stage 1038A, a second stage 1040A, a measurement system 1022A and an initialization system 1081A (illustrated in phantom). The stages 1038A, 1040A can be similar in design to the corresponding designs described above. The first mover assembly and the second mover assembly of the stage assembly 1020A are not illustrated in FIG. 10A. The mover assemblies can be similar to the corresponding components described above and illustrated in FIGS. 2A-4D. For example, the first mover assembly can be used to move the first stage 1038A along the X and Y axes and about the Z axis, and the second mover assembly can be used to move the second stage 1040A along the X, Y, and Z axes and about the X, Y, and Z axes. Alternatively, for example, the first mover assembly can be designed to move the first stage 1038A with more than three or less than three degrees of movement and/or the second mover assembly can be used to move the second stage 1040A with less than six degrees of movement.

The measurement system 1022A constantly monitors the position of the second stage 1040A. With this information, the second mover assembly can be controlled to precisely position the second stage 1040A. The design of the measurement system 1022A can vary according to the degrees of movement of the second stage 1040A. For example, the measurement system 1022A can measure the position of the second stage 1040A along at least one axis and/or about at least one axis and can utilize multiple laser interferometers, encoders, and/or other measuring devices.

In the embodiment illustrated in FIG. 10A, the measurement system 1022A includes six interferometer systems 1023A-1023C that cooperate to monitor the position of the second stage 1040A along three axes and about three axes. More specifically, in this embodiment, the measurement system 1022A includes (i) three spaced apart Z interferometer systems 1023A that cooperate to measure the position of the second stage 1040A along the Z axis, about the X axis and about the Y axis, (ii) two X interferometer systems 1023B that cooperate to measure the position of the second stage 1040A along the X axis and about the Z axis, and (iii) a Y interferometer system 1023C that measures the position of the second stage 1040A along the Y axis. In this embodiment, each interferometer system 1023A-1023C includes a first interferometer component 1025A that is positioned away from the second stage 1040A and a second interferometer component 1025B that is secured to the second stage 1040A and that moves with the second stage 1040A. The exact location of the interferometer components 1025A, 1025B can be varied to achieve the desired performance characteristics of the stage assembly 1020A.

In the embodiment illustrated in FIG. 10A, (i) each first interferometer component 1025A is an interferometer block that directs a laser beam 1027 at the second interferometer component 1025B and that receives the beam that is reflected off of the second interferometer component, and (ii) each second interferometer component 1025B is a reflector, e.g. a mirror. Alternatively, the first interferometer component can include the reflector while the second interferometer component can include the interferometer block. A suitable laser interferometer is sold by Agilent, located in Santa Clara, Calif.

In certain embodiments, the mechanical range of motion of the second stage 1040A about the X, Y and Z axes is much greater than the working range of one or more of the interferometer systems 1023A-1023C. Stated in another fashion, one or more of the interferometer systems 1023A-1023C can have a limited rotational working range. For example, for each interferometer system 1023A-1023C to function properly, the beam 1027 from the interferometer block must be reflected back to the interferometer block from the reflector (second interferometer component). If the angle of the reflector is not within the limited rotational working range, the beam will not be reflected back to the interferometer block. In one embodiment, each Z interferometer system 1023A has a FA working range, each X interferometer system 1023B has a SA working range, and the Y interferometer system 1023C has a TA working range.

The size of each limited rotational working range can vary according to the type of interferometer system 1023A-1023C. For example, in one type of interferometer system

1023A-1023C, in order to function properly, the reflector must be at a 90 degree angle plus or minus 0.06 degrees relative to the beam 1027. In this design, the working range is approximately 0.12 degrees. In alternative, non-exclusive embodiments, the working range is approximately 0.01, 0.05, 0.1, or 0.5 degrees.

When power is initially applied to the stage assembly 1020A, the second stage 1040A is usually in an unknown orientation, and the one or more of the interferometer systems 1023A-1023C may not be operational because the second stage 1040A is rotated outside of the working range. For example, if the second stage 1040A is rotated about the X axis or the Y axis an amount that is greater than the FA working range, the Z interferometer systems 1023A will not function. Somewhat similarly, if the second stage 1040A is rotated about the Z axis an amount that is greater than the SA working range and the TA working range, the X and Y interferometer systems 1023B, 1023C will not function.

In this design, the initialization system 1081A provides a way to get the second stage 1040A aligned in the correct orientation when the interferometer systems 1023A-1023C are not operational. In one embodiment, the initialization system 1081A monitors the position of the second stage 1040A when the second stage 1040A is rotated outside the working ranges. In this embodiment, the initialization system 1081A includes one or more sensors which can measure position of the second stage 1040A when the second stage 1040A is outside of the working ranges and/or over the full mechanical range of motion of the second stage 1040A.

In the embodiment illustrated in FIG. 10A, the initialization system 1081A includes six initial sensors 1083A-1083C (illustrated in phantom), namely (i) three spaced apart Z sensors 1083A that cooperate to measure the position of the second stage 1040A relative to the first stage 1038A along the Z axis, about the X axis and about the Y axis, (ii) two spaced apart X sensors 1083B that cooperate to measure the position of the second stage 1040A relative to the first stage 1038A along the X axis and about the Z axis, and (iii) a Y sensor 1083C that measures the position of the second stage 1040A relative to the first stage 1038A along the Y axis. Alternatively, for example, the initialization system 1081A can include less than six or more than six sensors and/or one or more of the sensors can reference movement relative to another structure other than the first stage 1038A.

In one embodiment, one or more of the initial sensors 1083A-1083C can be an absolute type sensor that has a fixed zero position. One such type of sensor is a capacitance gauge. Other absolute type sensors include potentiometers, LVDTS, and many optical sensors. With absolute type sensors 1083A-1083C, the desired orientation of the second stage 1040A about the X, Y and/or Z axes can be correlated to a particular set of sensor values. The correct target values for the absolute type sensors 1083A-1083C can be stored in the initialization software program of the control system 24 (illustrated in FIG. 1). The use of absolute type sensors allows for relatively fast initialization of the interferometer systems 1023A-1023C.

In another embodiment, one or more of the initial sensors 1083A-1083C can be incremental type sensor that measures incremental movement of the second stage 1040A relative to the first stage 1038A. One such incremental type sensor is an encoder.

In the embodiment illustrated in FIG. 10A, when the stage assembly 1020A is first started, the initialization process begins, and the control system controls the second mover assembly using the positional information from the initial sensors 1083A-1083C. This control can optionally happen at a relatively low initialization bandwidth. With this design, the second mover assembly is controlled to gradually move the second stage 1040A from its initial position to the target position. Once the position of the second stage 1040A has stabilized in the correct orientation, the interferometer systems 1023A-1023C can be initialized. Subsequently, the control system controls the second mover assembly using the positional information from the interferometer systems 1023A-1023C. Optionally the bandwidth can changed to a higher value.

Figure 10B:
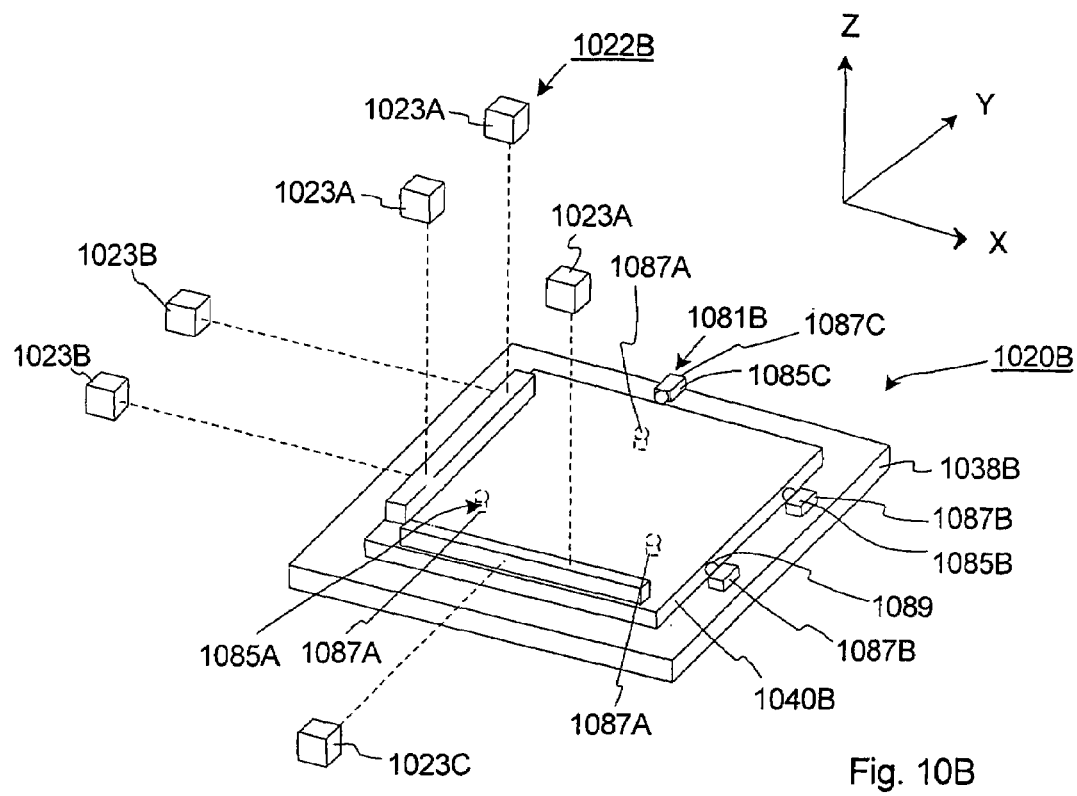
FIG. 10B is a simplified schematic of a still another embodiment of a portion of a stage assembly having features of the present invention.

FIG. 10B is a simplified top perspective view of a portion of another embodiment of a stage assembly 1020B having features of the present invention. For example, the stage assembly 1020B can be used as the wafer stage assembly 20 or the reticle stage assembly 18 in the exposure apparatus 10 of FIG. 1. Alternatively, the stage assembly 1020B can be used to move other types of devices.

The components of the stage assembly 1020B that are illustrated in FIG. 10B include a first stage 1038B, a second stage 1040B, a measurement system 1022B and an initialization system 1081B. The stages 1038B, 1040B and the measurement system 1022B can be similar in design to the corresponding designs described above. In FIG. 10B, the measurement system 1022B again includes six interferometer systems 1023A-1023C that cooperate to monitor the position of the second stage 1040A along three axes and about three axes.

In FIG. 10B, the initialization system 1081B again provides a way to get the second stage 1040A aligned in the correct orientation when the interferometer systems 1023A-1023C are not operational. In this embodiment, the initialization system 1081A includes one or more aligners 1085A-1085C that inhibit further movement of the second stage 1040A and that are positioned to cause the second stage 1040B to be rotated within the respective working range.

In the embodiment illustrated in FIG. 10B, the initialization system 1081B includes three aligners 1085A-1085C, namely a Z aligner 1085A, an X aligner 1085B, and a Y aligner 1085C. In this embodiment, the Z aligner 1085A includes three spaced apart Z hard stops 1087A (illustrated in phantom) that cooperate to inhibit movement of the second stage 1040B along the Z axis and that orientate the second stage 1040B about the X and Y axes. The X aligner 1085B includes two spaced apart X hard stops 1087B that cooperate to inhibit movement of the second stage 1040B along the X axis and that orientate the second stage 1040B about the Z axis. The Y aligner 1085C includes a Y hard stop 1087C that inhibits movement of the second stage 1040B along the Y axis. Alternatively, for example, the initialization system 1081B can include less than three or more than three aligners. For example, the Y aligner 1085C may not be necessary because, the other aligners 1085A, 1085B can be used to properly orientate the second stage 1040B about the X, Y and Z axes.

In one embodiment, one or more of the hard stops 1087A-1087C includes a contact area 1089 that is made of a low-friction material or rolling elements (e.g., cam followers) to inhibit friction from hindering the alignment procedure.

Alternatively, for example, one or more of the hard stops can be replaced with one or more limit switch or optical sensors.

In FIG. 10B, each of the stops 1087A-1087C is fixedly secured to the first stage 1038B and the contact area 1089 engages the second stage 1040B. Alternatively, for example, one or more of the stops 1087A-1087C can be fixedly secured to another structure. For example, one or more of the stops 1087A-1087C can be secured to the second stage 1040B and the contact area 1089 can engage the first stage 1038B or another structure.

In this embodiment, when the stage assembly 1020B is first started, the initialization process begins, and the control system controls the second mover assembly in an open loop fashion without positional information. With this design, the second mover assembly is controlled to gradually move the second stage 1040A from its initial position along one axis (e.g. along the Z axis) until the second stage 1040A engages the respective stop(s) 1087A-1087C (e.g. the Z stops 1087A). Next, the second mover assembly is controlled to gradually move the second stage 1040A along the next axis (e.g. along the X axis) until the second stage 1040A engages the respective stop(s) 1087A-1087C (e.g. the X stops 1087B). Finally, the second mover assembly is controlled to gradually move the second stage 1040A along the remaining axis (e.g. along the Y axis) until the second stage 1040A engages the respective stop(s) 1087A-1087C (e.g. the Y stop 1087C).

Once the second stage 1040A is positioned against the stop(s) 1087A-1087C, the interferometer systems 1023A-1023C can be initialized. Subsequently, the control system controls the second mover assembly using the positional information from the interferometer systems 1023A-1023C. It should be noted that the X and Y interferometer systems 1023B, 1023C can be initialized once the second stage 1040B engages the Z stops 1087A and the Z interferometer system 1023A can be initialized once the second stage 1040B engages the X stops 1087B.

In certain designs, the activation of the movers in the second mover assembly occurs in a sequence that produces a repeatable alignment of the second stage 1040B.

Figure 10C:
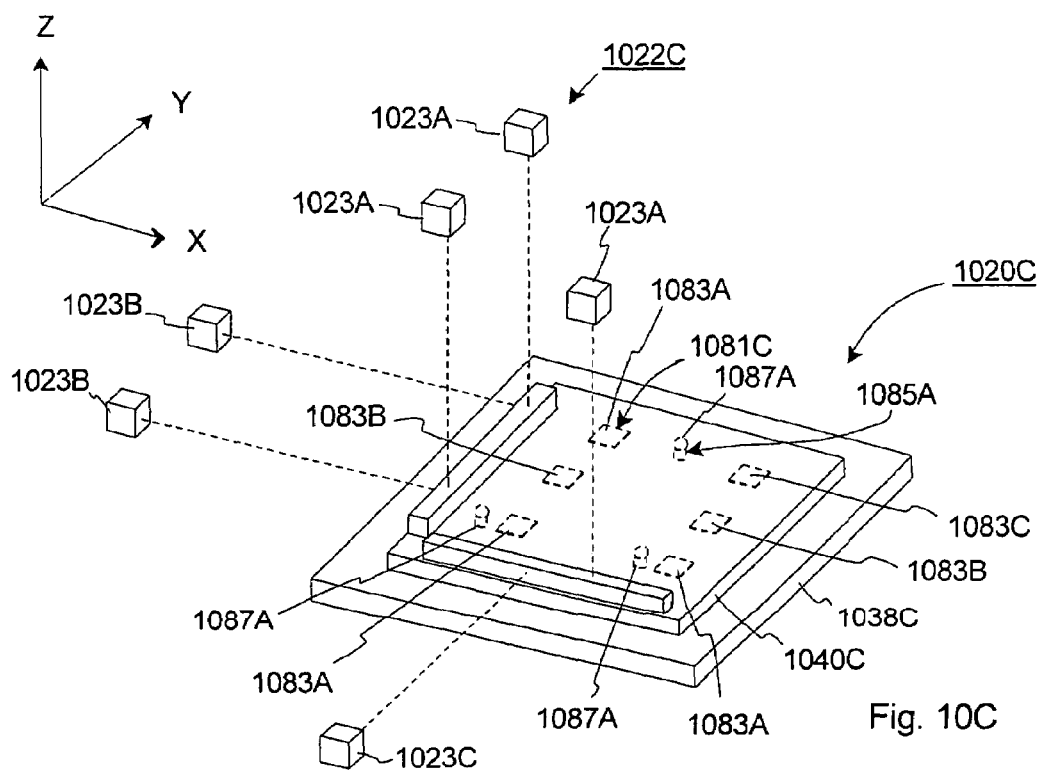
FIG. 10C is a simplified schematic of another embodiment of a portion of a stage assembly having features of the present invention.

FIG. 10C is a simplified top perspective view of a portion of yet another embodiment of a stage assembly 1020C having features of the present invention. For example, the stage assembly 1020C can be used as the wafer stage assembly 20 or the reticle stage assembly 18 in the exposure apparatus 10 of FIG. 1. Alternatively, the stage assembly 1020C can be used to move other types of devices.

The components of the stage assembly 1020C that are illustrated in FIG. 10C include a first stage 1038C, a second stage 1040C, a measurement system 1022C and an initialization system 1081C. The stages 1038C, 1040C and the measurement system 1022C can be similar in design to the corresponding designs described above. In FIG. 10C, the measurement system 1022C again includes six interferometer systems 1023A-1023C that cooperate to monitor the position of the second stage 1040C along three axes and about three axes.

In FIG. 10C, the initialization system 1081C includes a combination of one or more initial sensors 1083A-1083C, and one or more aligners 1085A.

In the embodiment illustrated in FIG. 10C, the initialization system 1081C includes (i) six initial sensors 1083A-1083C (illustrated in phantom), namely (i) three spaced apart Z sensors 1083A that cooperate to measure the position of the second stage 1040A along the Z axis, about the X axis and about the Y axis, (ii) two spaced apart X sensors 1083B that cooperate to measure the position of the second stage 1040A along the X axis and about the Z axis, and (iii) a Y sensor 1083C that measures the position of the second stage 1040A relative to the first stage 1038A along the Y axis, and (iv) a Z aligner 1085A (illustrated in phantom), including three spaced apart Z stops 1087A that cooperate to inhibit movement of the second stage 1040B along the Z axis and that orientate the second stage 1040B about the X and Y axes.

In this embodiment, each of the Z sensors 1083A is an incremental type sensor and the X and Y sensors 1083B, 1083C are an absolute type sensor. In this embodiment, one or more of the Z measurers 406 (illustrated in FIGS. 4A and 9A) can be used as the Z sensors 1083A.

In this embodiment, when the stage assembly 1020B is first started, the initialization process begins, and the control system controls the second mover assembly using positional information from the sensors 1083A-1083C. With this design, the second mover assembly is controlled to gradually move the second stage 1040A from its initial position along the Z axis until the second stage 1040A engages the Z aligner 1085A. Further, the second mover assembly is controlled to gradually move the second stage 1040A from its initial position to the target position along the X and Y axes and about the Z axis using positional information from the X and Y sensors 1083B, 1083C. Once the position of the second stage 1040A has stabilized in the correct orientation, the interferometer systems 1023A-1023C can be initialized. Subsequently, the control system controls the second mover assembly using the positional information from the interferometer systems 1023A-1023C.

As discussed above, the Z measurer 406 (illustrated in FIGS. 4A and 9A) for compensating the stiffness of the Z dampeners 410 can be an absolute type sensor or an incremental type sensor. In the cases that one or more of the Z measurers 406 are an absolute type sensor, the Z measurer 406 can be used as the Z sensors 1083A of the initial sensors in the initialization system 1081A and 1081C.

Figure 11A:
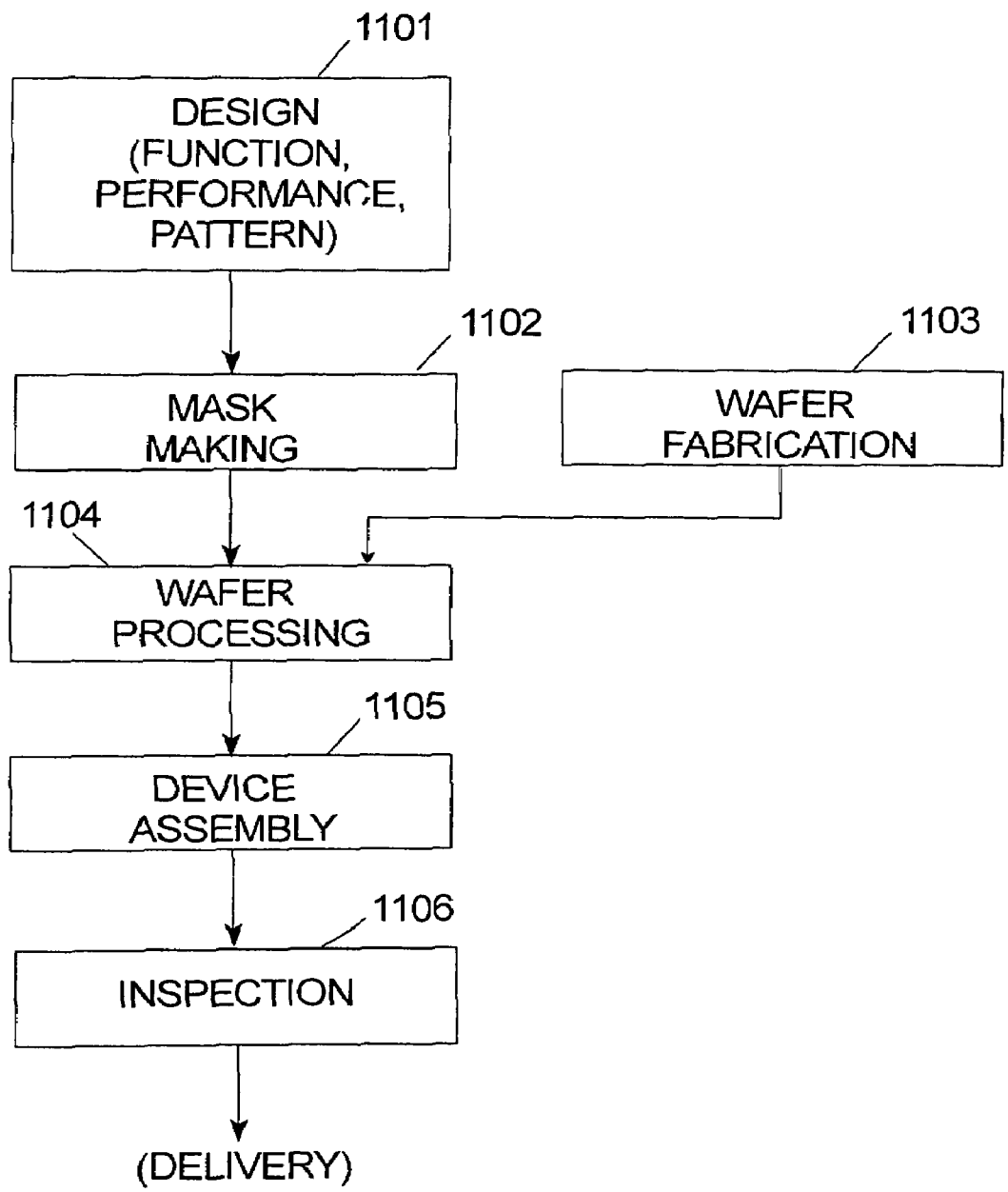
FIG. 11A is a flow chart that outlines a process for manufacturing a device in accordance with the present invention.

Semiconductor devices can be fabricated using the above described systems, by the process shown generally in FIG. 11A. In step 1101 the device's function and performance characteristics are designed. Next, in step 1102, a mask (reticle) having a pattern is designed according to the previous designing step, and in a parallel step 1103 a wafer is made from a silicon material. The mask pattern designed in step 1102 is exposed onto the wafer from step 1103 in step 1104 by a photolithography system described hereinabove in accordance with the present invention. In step 1105, the semiconductor device is assembled (including the dicing process, bonding process and packaging process), finally, the device is then inspected in step 1106.

Figure 11B:
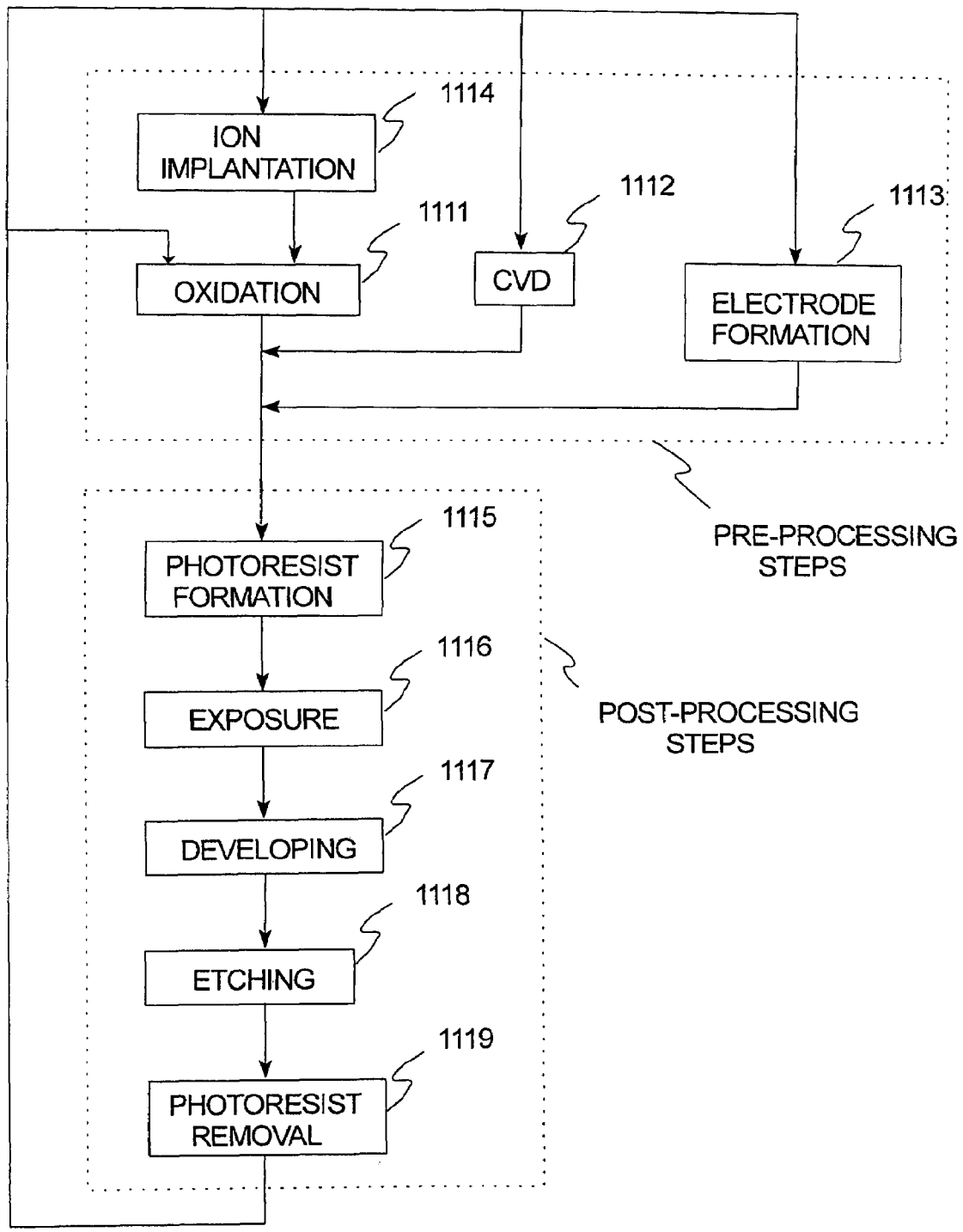
FIG. 11B is a flow chart that outlines device processing in more detail.

FIG. 11B illustrates a detailed flowchart example of the above-mentioned step 1104 in the case of fabricating semiconductor devices. In FIG. 11B, in step 1111 (oxidation step), the wafer surface is oxidized. In step 1112 (CVD step), an insulation film is formed on the wafer surface. In step 1113 (electrode formation step), electrodes are formed on the wafer by vapor deposition. In step 1114 (ion implantation step), ions are implanted in the wafer. The above mentioned steps 1111-1114 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1115 (photoresist formation step), photoresist is applied to a wafer. Next, in step 1116 (exposure step), the above-mentioned exposure device is used to transfer the circuit pattern of a mask (reticle) to a wafer. Then in step 1117 (developing step), the exposed wafer is developed, and in step 1118 (etching step), parts other than residual photoresist (exposed material surface) are removed by etching. In step 1119 (photoresist removal step), unnecessary photoresist remaining after etching is removed. Multiple circuit patterns are formed by repetition of these preprocessing and post-processing steps.

This invention can be utilized in an immersion type exposure apparatus with taking suitable measures for a liquid. For example, PCT Patent Application WO 99/49504 discloses an exposure apparatus in which a liquid is supplied to the space between a substrate (wafer) and a projection lens system in exposure process. As far as is permitted, the disclosures in WO 99/49504 are incorporated herein by reference.

Further, this invention can be utilized in an exposure apparatus that comprises two or more substrate and/or reticle stages. In such apparatus, the additional stage may be used in parallel or preparatory steps while the other stage is being used for exposing. Such a multiple stage exposure apparatus are described, for example, in Japan Patent Application Disclosure No. 10-163099 as well as Japan Patent Application Disclosure No. 10-214783 and its counterparts U.S. Pat. No. 6,341,007, U.S. Pat. No. 6,400,441, U.S. Pat. No. 6,549,269, and U.S. Pat. No. 6,590,634. Also it is described in Japan Patent Application Disclosure No. 2000-505958 and its counterparts U.S. Pat. No. 5,969,411 as well as U.S. Pat. No. 6,208,407. As far as is permitted, the disclosures in the above-mentioned U.S. Patents, as well as the Japan Patent Applications, are incorporated herein by reference.

This invention can be utilized in an exposure apparatus that has a movable stage retaining a substrate (wafer) for exposing it, and a stage having various sensors or measurement tools for measuring, as described in Japan Patent Application Disclosure 11-135400. As far as is permitted, the disclosures in the above-mentioned Japan patent application are incorporated herein by reference.

While the current invention is disclosed in detail herein, it is to be understood that it is merely illustrative of the presently preferred embodiments of the invention and that no limitations are intended to the details of construction or design herein shown other than as described in the appended claims.

What is claimed is:

1. A stage assembly that positions a work piece about a first axis, the stage assembly comprising:
   a first stage;
   a second stage that retains the work piece;
   a second mover assembly that moves the second stage relative to the first stage about the first axis;
   a measurement system that monitors the position of the second stage about the first axis when the second stage is positioned within a FA working range about the first axis; and
   an initialization system that facilitates positioning of the second stage about the first axis when the second stage is rotated about the first axis outside the FA working range.

2. The stage assembly of claim 1 wherein the initialization system monitors the position of the second stage about the first axis.

3. The stage assembly of claim 1 wherein the measurement system monitors the position of the second stage about a second axis when the second stage is positioned within a SA working range and wherein the initialization system monitors the position of the second stage about the first axis and the second axis.

4. The stage assembly of claim 3 wherein the measurement system monitors the position of the second stage about a third axis when the second stage is positioned within a TA working range and wherein the initialization system monitors the position of the second stage about the third axis.

5. The stage assembly of claim 1 wherein the initialization system includes a first aligner and wherein the second mover assembly moves the second stage against the first aligner to orientate the second stage within the FA working range.

6. The stage assembly of claim 5 wherein the initialization system includes a second aligner and wherein the second mover assembly moves the second stage against the second aligner to orientate the second stage within a SA working range.

7. The stage assembly of claim 6 wherein the initialization system includes a third aligner and wherein the second mover assembly moves the second stage against the third aligner to orientate the second stage within a TA working range about the third axis.

8. The stage assembly of claim 5 wherein the first aligner includes a contact area that allows the second stage to move relative to the first aligner while engaging the first aligner.

9. The stage assembly of claim 1 wherein the initialization system includes a first sensor that monitors the position of the second stage and a first aligner, and wherein the second mover assembly moves the second stage against the first aligner to orientate the second stage within the FA working range.

10. The stage assembly of claim 1 further comprising a first mover assembly that moves the first stage with three degrees of movement.

11. The stage assembly of claim 1 wherein the second mover assembly includes a mover and a dampener that reduces the transmission of vibration from the first stage to the second stage, and the stage assembly further comprises a control system that directs power to the mover to compensate for vibration from the first stage.

12. An exposure apparatus including an illumination system and the stage assembly of claim 1.

13. A method for manufacturing a device, the method comprising the steps of providing a substrate and forming an image on the substrate with the exposure apparatus of claim 12.

14. A method for manufacturing a wafer, the method comprising the steps of providing a substrate and forming an image on the wafer with the exposure apparatus of claim 12.

15. The stage assembly of claim 1 wherein the second mover assembly includes a dampener that reduces the transmission of vibration from the first stage to the second stage, and a detector that detects the positional information related to the motion of the dampener along the first axis, and the stage assembly further comprises a control system that compensates for vibration from the first stage utilizing the information detected by the detector, the initialization system monitoring the position of the second stage by utilizing the detector.

16. A method for positioning a work piece about a first axis, the method comprising the steps of:
   providing a first stage;
   providing a second stage that retains the work piece;
   moving the second stage relative to the first stage about the first axis with a second mover assembly;
   monitoring the position of the second stage about the first axis when the second stage is positioned within a FA working range about the first axis with a measurement system; and
   initializing the measurement system with an initialization system that facilitates positioning of the second stage about the first axis when the second stage is rotated about the first axis outside the FA working range.

17. The method of claim 16 wherein the initialization system monitors the position of the second stage about the first axis.

18. The method of claim 16 wherein the step of monitoring the position includes the step of monitoring the position of the second stage about a second axis when the second stage is positioned within a SA working range and wherein the step of initializing includes monitoring the position of the second stage about the first axis and the second axis.

19. The method of claim 16 wherein the initialization system includes a first aligner and wherein the step of moving includes moving the second stage against the first aligner to orientate the second stage within the FA working range.

20. The method of claim 19 wherein the initialization system includes a second aligner and wherein the step of moving includes moving the second stage against the second aligner to orientate the second stage within a SA working range.

21. The method of claim 19 wherein the first aligner includes a contact area that allows the second stage to move relative to the first aligner while engaging the first aligner.

22. The method of claim 16 wherein the initialization system includes a first sensor that monitors the position of the second stage and a first aligner, and wherein the step of moving includes moving the second stage against the first aligner to orientate the second stage within the FA working range.

23. The method of claim 16 further comprising the step of moving the first stage with three degrees of movement with a first mover assembly.

24. A method for exposing on a work piece, the method comprising the steps of generating a beam and positioning the work piece in the path of the beam by the method of claim 16.

25. A stage assembly that positions a work piece about a first axis, the stage assembly comprising:
   a first stage;
   a second stage that retains the work piece;
   a second mover assembly that moves the second stage relative to the first stage about the first axis;
   a measurement system that monitors the position of the second stage about the first axis when the second stage is positioned within a FA working range about a second axis that is orthogonal to the first axis; and
   an initialization system that facilitates positioning of the second stage about the first axis when the second stage is rotated about the second axis outside the FA working range.

* * * * *